(12) United States Patent
Scogna et al.

(10) Patent No.: US 11,659,650 B2
(45) Date of Patent: May 23, 2023

(54) DUAL-SPIRAL COMMON-MODE FILTER

(71) Applicant: Western Digital Technologies, Inc., San Jose, CA (US)

(72) Inventors: Antonio Ciccomancini Scogna, Cupertino, CA (US); Xinzhi Xing, San Jose, CA (US)

(73) Assignee: Western Digital Technologies, Inc., San Jose, CA (US)

(*) Notice: Subject to any disclaimer, the term of this patent is extended or adjusted under 35 U.S.C. 154(b) by 113 days.

(21) Appl. No.: 17/180,779

(22) Filed: Feb. 20, 2021

(65) Prior Publication Data

US 2022/0201844 A1 Jun. 23, 2022

Related U.S. Application Data

(60) Provisional application No. 63/127,881, filed on Dec. 18, 2020.

(51) Int. Cl.
   *H05K 1/02* (2006.01)
   *H05K 1/11* (2006.01)
   (Continued)

(52) U.S. Cl.
   CPC ....... *H05K 1/0245* (2013.01); *H01P 1/20381* (2013.01); *H01P 3/026* (2013.01);
   (Continued)

(58) Field of Classification Search
   CPC .... H05K 1/165; H05K 1/0224; H05K 1/0245; H05K 1/111; H05K 3/4644;
   (Continued)

(56) References Cited

U.S. PATENT DOCUMENTS 5,477,204 A * 12/1995 Li .................. H03F 1/565
                                                      336/200
5,801,597 A   9/1998 Carter et al.
(Continued)

FOREIGN PATENT DOCUMENTS

CN   106255307 A   12/2016
JP   H02181961 A   7/1990
(Continued)

OTHER PUBLICATIONS

Boutejdar, A., et al., "New Low-Pass Filter Design Using Compensated Microstrip Capacitor and Coupled Meander Defected Ground Structure (DGS)," 2009 German Microwave Conference, Mar. 16, 2009.
(Continued)

*Primary Examiner* — Steven T Sawyer

(57) ABSTRACT

Disclosed herein are dual-spiral common-mode filters, printed circuit boards (PCBs) comprising such dual-spiral common-mode filters, and devices comprising such dual-spiral common-mode filters and PCBs. A dual-spiral common-mode filter is patterned into the reference plane of a PCB. The dual-spiral common-mode filter comprises a first spiral portion connected to a second spiral portion. The spiral portions may be substantially identical, or mirror images of each other, or different from each other. One or more signal traces in a signal trace layer of the PCB pass over the dual-spiral common-mode filter. The disclosed dual-spiral common-mode filters can replace both conventional patterned ground structure (PGS) filters used for radio-frequency interference mitigation and the cutouts often used in the reference plane of a PCB to mitigate impedance mismatches due to DC blocking capacitors. Also disclosed herein are methods of making PCBs that include dual-spiral common-mode filters.

20 Claims, 12 Drawing Sheets

(51) Int. Cl.
   *H05K 3/46* (2006.01)
   *H01P 3/02* (2006.01)
   *H01P 1/203* (2006.01)
(52) U.S. Cl.
   CPC ........... *H05K 1/111* (2013.01); *H05K 3/4644* (2013.01); *H05K 2201/09236* (2013.01); *H05K 2201/1006* (2013.01)
(58) Field of Classification Search
   CPC . H05K 2201/09236; H05K 2201/1006; H05K 1/025; H05K 1/0298; H05K 1/0233; H01P 1/20381; H01P 3/026
   See application file for complete search history.

(56) References Cited

U.S. PATENT DOCUMENTS

| | | |
|---|---|---|
| 6,088,235 A | 7/2000 | Chiao et al. |
| 6,956,444 B2 | 10/2005 | Miller |
| 7,109,817 B2 | 9/2006 | Kolb et al. |
| 7,130,434 B1 | 10/2006 | Grattan et al. |
| 7,271,978 B1 | 9/2007 | Santini et al. |
| 7,330,325 B2 | 2/2008 | Vacar et al. |
| 7,529,103 B2 | 5/2009 | Chen et al. |
| 7,535,321 B1 | 5/2009 | Degerstrom et al. |
| 7,656,601 B1 | 2/2010 | Li |
| 7,657,564 B2 | 2/2010 | Hsu et al. |
| 7,825,750 B2 | 11/2010 | Lee et al. |
| 7,932,793 B2 | 4/2011 | Wu et al. |
| 8,125,727 B2 | 2/2012 | Tsuwako et al. |
| 8,126,402 B1 | 2/2012 | Jatou et al. |
| 8,164,006 B2 | 4/2012 | Kim et al. |
| 8,339,212 B2 | 12/2012 | Wu et al. |
| 8,659,365 B2 | 2/2014 | Wu et al. |
| 8,680,403 B2 | 3/2014 | Howard et al. |
| 8,848,385 B2 | 9/2014 | Warwick et al. |
| 8,907,748 B2 | 12/2014 | Pajovic |
| 9,030,287 B2 | 5/2015 | Motomiya et al. |
| 9,059,491 B2 | 6/2015 | Lim et al. |
| 9,245,681 B2 | 1/2016 | Kato et al. |
| 9,264,010 B2 | 2/2016 | Lee et al. |
| 9,485,869 B2 | 11/2016 | Schuster |
| 9,525,441 B2 | 12/2016 | Chen et al. |
| 9,717,140 B2 | 7/2017 | Contreras et al. |
| 9,786,331 B1 | 10/2017 | Wallash |
| 9,881,650 B1 | 1/2018 | Sotome et al. |
| 9,907,160 B2 | 2/2018 | Lin |
| 10,244,618 B2 | 3/2019 | Wallash et al. |
| 10,285,259 B2 | 5/2019 | Wallash et al. |
| 10,411,670 B2 | 9/2019 | Xing et al. |
| 10,491,184 B1 | 11/2019 | Yan |
| 10,499,489 B2 | 12/2019 | Bois et al. |
| 10,499,490 B2 | 12/2019 | Lee |
| 10,681,842 B1 | 6/2020 | Hart et al. |
| 2005/0103522 A1 | 5/2005 | Grundy et al. |
| 2006/0022772 A1* | 2/2006 | Kanno ................ H01P 1/20 333/202 |
| 2006/0081397 A1 | 4/2006 | Enchi et al. |
| 2007/0069834 A1 | 3/2007 | Ikuta et al. |
| 2010/0073109 A1 | 3/2010 | Wu et al. |
| 2010/0109816 A1 | 5/2010 | Tzuang et al. |
| 2010/0321135 A1 | 12/2010 | Kushta |
| 2011/0273245 A1 | 11/2011 | Pai et al. |
| 2011/0298563 A1* | 12/2011 | Pai .................. H05K 1/0224 333/185 |
| 2011/0309898 A1 | 12/2011 | Pai et al. |
| 2012/0194290 A1 | 8/2012 | Wu et al. |
| 2013/0271909 A1 | 10/2013 | Chen et al. |
| 2014/0049343 A1 | 2/2014 | Sakai |
| 2014/0218132 A1 | 8/2014 | Chen |
| 2016/0087323 A1 | 3/2016 | Wu et al. |
| 2016/0142031 A1 | 5/2016 | Ueki et al. |
| 2017/0127509 A1 | 5/2017 | Contreras et al. |
| 2017/0295644 A1 | 10/2017 | Wallash et al. |
| 2018/0233796 A1 | 8/2018 | Zhang et al. |
| 2018/0376580 A1* | 12/2018 | Xing .................... H05K 3/0017 |
| 2019/0207579 A1* | 7/2019 | O'Brien ................ H01F 27/28 |

FOREIGN PATENT DOCUMENTS

| | | |
|---|---|---|
| JP | H08293416 A | 11/1996 |
| TW | M385809 | 8/2010 |
| WO | 2014045792 A1 | 3/2014 |

OTHER PUBLICATIONS

Fangxu Yang, et al., "An Ultra-Wideband Common-Mode Noise Filter for Differential Signals Using Compact Patterned Ground Structure," IEEE MTT-S International Microwave Symposium (IMS), May 2016.
Gao, Si-Ping et al., "Common-Mode Filter using Cavity-Backed Defected Ground Structure for Multilayer PCB," 2016 Asia-Pacific International Symposium on Electromagnetic Compatibility (APEMC), Shenzhen, May 2016, pp. 916-918.
Hailing Yue, et al., "Modified Spiral Shaped Defected Ground Structure with Spurious Free Band Rejection Performance," 2016 IEEE 17th Annual Wireless and Microwave Technology Conference (WAMICON), Apr. 2016.
Ho Seong Lee et al., "A Compact Common-Mode Suppression Filter Using Modified Ground Structure for High Speed Digital Interconnects on Multi-layered PCB," Proc. of the 2014 International Symposium on Electromagnetic Compatibility (EMC Europe 2014), Gothenburg, Sweden, Sep. 1-4, 2014.
International Search Report and Written Opinion in PCT Application No. PCT/US2018/022519 (filed Mar. 14, 2018), dated Jul. 4, 2018.
International Search Report and Written Opinion in PCT Application No. PCT/US2018/022800 (filed Mar. 16, 2018), dated Jun. 29, 2018.
International Search Report and Written Opinion in PCT Application No. PCT/US2018/022813 (filed Mar. 16, 2018), dated Jun. 26, 2018.
Liu, Qian et al., "Common-Mode Filters With Interdigital Fingers for Harmonics Suppression and Lossy Materials for Broadband Suppression," IEEE Transactions on Electromagnetic Compatibility, vol. 57, Issue 6, Dec. 2015.
M. S. Razalli et al., "Novel compact 'via-less, ultra-wide band filter utilizing capacitive microstrip patch," Progress in Electromagnetics Research, PIER 91, 213-227, 2009.
N. Suresh Kumar et. al., "Suppression of common-mode radiation from high speed printed circuit board using modified ground patterns," International Journal of Information Sciences and Techniques (IJIST) vol. 4, No. 3, May 2014.
Panasonic, "Common mode Noise Filter Array Type: EXC28CG," Nov. 2, 2012.
Shu-Jung Wu et al., "A novel HU-shaped common-mode filter for GHz differential signals," 2008 IEEE International Symposium on Electromagnetic Compatibility, Aug. 18, 2008.
Shu-Jung Wu, et al., "A Novel Wideband Common-Mode Suppression Filter for Gigahertz Differential Signals Using Coupled Patterned Ground Structure," IEEE Transactions on Microwave Theory and Techniques, vol. 57, No. 4, Apr. 2009.
Tektronix, "Measurement Solutions for Disk Drive Design," Sep. 2006.
Xian-Ke Gao, et al., "A Compact Common-mode Noise Suppression Filter for High Speed Differential Signals Using Defected Ground Structure," 2015 Asia-Pacific Symposium on Electromagnetic Compatibility (APEMC), May 2015.
Z. Zeng, S. J. Chen and C. Fumeaux, "A Reconfigurable Filter Using Defected Ground Structure for Wideband Common-Mode Suppression," in IEEE Access, vol. 7, pp. 36980-36990, Mar. 2019, doi: 10.1109/ACCESS.2019.2906340.

* cited by examiner

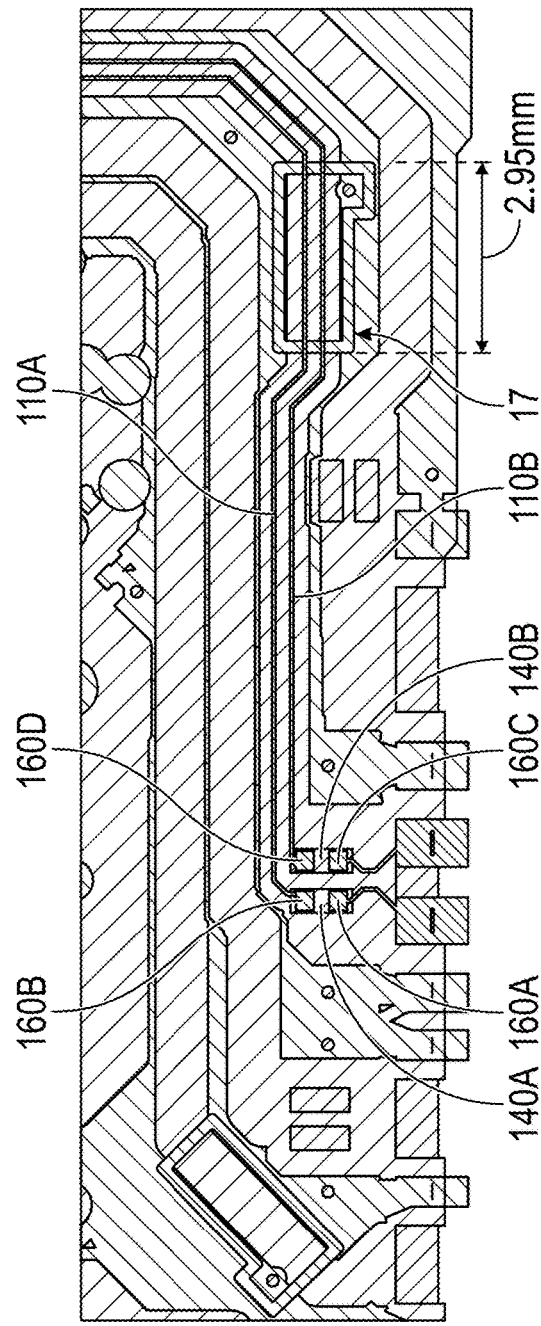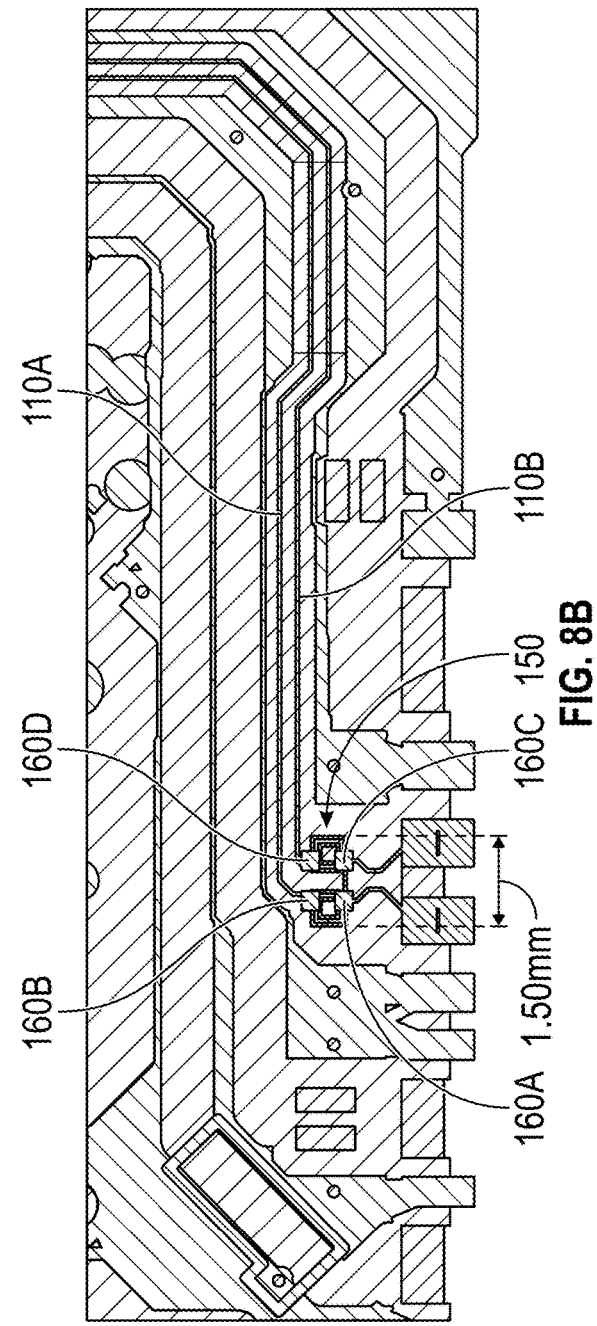
FIG. 8A
FIG. 8B

DUAL-SPIRAL COMMON-MODE FILTER

CROSS-REFERENCE TO RELATED APPLICATIONS

This application claims the benefit of, and hereby incorporates by reference in its entirety for all purposes, U.S. provisional patent application No. 63/127,881, filed Dec. 18, 2020 and entitled "DUAL-SPIRAL COMMON-MODE FILTER".

BACKGROUND

There are many ways to transmit signals over conductors. In single-ended signaling, one conductor carries a signal as a voltage that varies over time. The signal is referenced to a fixed potential, which is usually a 0 V node referred to as ground. Thus, one conductor carries the signal and one conductor carries the reference potential. The receiver extracts information by detecting the difference between the signal-carrying conductor and the reference potential.

In differential signaling (sometimes referred to as double-ended signaling), information is transmitted over two conductors using two complementary voltage signals, one over each conductor. One conductor carries the signal, and the other carries the inverted signal. The pair of conductors can be, for example, traces on a printed circuit board (PCB). The receiver extracts information from the pair of conductors by detecting the difference in potential between the inverted and non-inverted signals. Ideally, the voltage signals on the two conductors have equal amplitude and opposite polarity relative to a common-mode voltage, in which case they are said to be balanced. The return currents associated with these voltages also have equal amplitude and opposite polarity and thus cancel each other out; for this reason, differential signals ideally have zero current flowing through the ground connection.

Relative to single-ended signaling, differential signaling offers a number of advantages for high-speed data transfer. For example, if electromagnetic interference (EMI; also referred to as radio-frequency interference (RFI)) or crosstalk (e.g., EMI generated by nearby signals) is introduced from a source outside the differential conductors, it is added equally to the inverted and non-inverted signals. Because the receiver operates on the difference in voltage between the two signals, the receiver circuitry will greatly reduce the amplitude of any interference or crosstalk that is present in the received signal. Thus, differential signals are less sensitive than single-ended signals to EMI, crosstalk, or any other noise that couples into both signals of the differential pair.

Another advantage of differential signaling is that because differential signals have higher EMI immunity than single-ended signals, differential signals can use lower voltages than single-ended signals and still maintain adequate signal-to-noise ratio (SNR). In addition, the SNR with differential signaling is two times that of an equivalent single-ended implementation because the dynamic range at the differential receiver is twice as high as the dynamic range of each signal within the differential pair.

Several advantages flow from the ability of differential signaling to successfully transfer data using lower signal voltages, including that supply voltage requirements are lower, which reduces power consumption. In addition, smaller voltage transitions, which are possible because of greater immunity to EMI, allow for higher operating frequencies. Consequently, high-speed digital systems often use differential signaling.

Differential signaling also tends to cause less EMI than single-ended signaling. The rising and falling edges of digital signals can generate significant amounts of EMI, and both single-ended and differential signals generate EMI. But because the currents in the conductors in differential signaling travel in opposite directions, the two signals in a differential pair create electromagnetic fields that are opposite in polarity. If the differential signal paths are identical and in close proximity to each other, the individual electromagnetic fields caused by the two signals will largely cancel each other. If, however, the two signal paths are not identical, the generated magnetic fields will not be exactly equal and opposite and will not completely cancel each other. As a result, the common mode current on the two conductors can generate an electromagnetic field outside the pair of conductors, which act like an antenna and radiate EMI. In addition, due to imperfections in integrated circuit processes, mismatches in the different pair circuit drivers can produce an inherent common-mode signal, which can create EMI.

Although differential signal paths are ideally identical, and the signals carried on the two conductors ideally have equal amplitude and opposite polarity, practical systems using differential signaling typically suffer from intrinsic common-mode noise as well as interference caused by sources outside the differential conductors, and the differential conductors can also radiate EMI and thereby cause interference to external systems or nearby circuits. Collectively, the common-mode noise and interference (whether received or generated) are referred to herein simply as "common-mode noise." Common-mode noise can be caused by clock skew, differences in amplitude between the signals on the two paths, unbalanced routing (e.g., one of the two conductors' paths is longer or shorter than the other, or the distance between conductors varies along their lengths, etc.), and other factors. Above the gigahertz frequency range, common-mode interference signals can degrade differential signal integrity and/or power integrity, and the use of differential signaling may also cause EMI. As a consequence, common-mode noise can degrade the SNR of the transmitted signal and cause detection errors. Likewise, single-ended signaling also suffers from noise and EMI, and can also generate EMI that can adversely affect other receivers.

Therefore, there is an ongoing need for ways to reduce common-mode noise.

SUMMARY

This summary represents non-limiting embodiments of the disclosure.

Disclosed herein are dual-spiral common-mode filters, PCBs including such dual-spiral common-mode filters, and devices, such as data storage devices, including such PCBs.

In some embodiments, a PCB comprises a signal trace layer and a reference plane situated under the signal trace layer. In some embodiments, the signal trace layer comprises a signal trace comprising a first portion and a second portion, wherein the first and second portions of the signal trace are disjoint, a first component pad coupled to the first portion of the signal trace, and a second component pad coupled to the second portion of the signal trace. In some embodiments, the reference plane comprises a dual-spiral common-mode filter comprising a first spiral portion connected to a second spiral portion situated under at least a portion of (a) the first component pad, (b) the second component pad, or (c) both (a) and (b).

In some embodiments, a spiraling direction of the first spiral portion is opposite a spiraling direction of the second spiral portion. In some embodiments, a spiraling direction of the first spiral portion and a spiraling direction of the second spiral portion are the same. In some embodiments, the first and second spiral portions are approximate mirror images of each other.

In some embodiments, each of the first and second spiral portions has a substantially rectangular shape. In some embodiments, an aspect ratio of the dual-spiral common-mode filter is between 1 and approximately 6.

In some embodiments, an overall length of the dual-spiral common-mode filter is between approximately 10 mm and approximately 25 mm. In some embodiments, a pattern width of the dual-spiral common-mode filter is between approximately 0.05 mm and approximately 0.15 mm. In some embodiments, the signal trace is a first signal trace and the at least part of the dual-spiral common-mode filter is a first at least part of the dual-spiral common-mode filter, and the signal trace layer further comprises a second signal trace, the second signal trace comprising a first portion and a second portion, wherein the first and second portions of the second signal trace are disjoint, a third component pad coupled to the first portion of the second signal trace, and a fourth component pad coupled to the second portion of the second signal trace. In some embodiments, a second at least part of the dual-spiral common-mode filter is situated under or over at least a portion of (i) the third component pad, (ii) the fourth component pad, or (iii) both (i) and (ii).

In some embodiments, the dual-spiral common-mode filter has a substantially rectangular shape, and an aspect ratio of the dual-spiral common-mode filter is greater than 1, and a longer dimension of the dual-spiral common-mode filter is perpendicular to the first and second signal traces. In some embodiments, the first and second spiral portions are approximate mirror images of each other.

In some embodiments, a method of making a printed circuit board comprises patterning a dual-spiral common-mode filter onto a reference plane, and forming a signal layer comprising at least one signal trace that passes over the dual-spiral common-mode filter. In some embodiments, the signal layer further comprises first and second component pads, and the at least one signal trace comprises a first portion terminating in the first component pad and a second portion emanating from the second component pad, and the first and second component pads are situated at least partially over the dual-spiral common-mode filter. In some embodiments, the method further comprises fabricating an insulating layer between the reference plane and the signal layer. In some embodiments, the dual-spiral common-mode filter comprises a first spiral portion connected to a second spiral portion. In some embodiments, a spiraling direction of the first spiral portion is opposite a spiraling direction of the second spiral portion.

In some embodiments, a PCB comprises a signal trace layer comprising at least one signal trace, a reference plane comprising a dual-spiral common-mode filter, wherein the dual-spiral common-mode filter comprises a pattern comprising a first spiral portion connected to a second spiral portion by a connector portion, and an insulating layer disposed between the signal trace layer and the reference plane, wherein the dual-spiral common-mode filter is situated below the at least one signal trace.

In some embodiments, a length of the pattern is between approximately 10 mm and approximately 25 mm. In some embodiments, a spiraling direction of the first spiral portion is opposite a spiraling direction of the second spiral portion. In some embodiments, the first and second spiral portions are approximate mirror images of each other. In some embodiments, each of the first and second spiral portions has a substantially rectangular shape. In some embodiments, an aspect ratio of the dual-spiral common-mode filter is between 1 and approximately 6. In some embodiments, a pattern width of the dual-spiral common-mode filter is between approximately 0.05 mm and approximately 0.15 mm.

BRIEF DESCRIPTION OF THE DRAWINGS

Objects, features, and advantages of the disclosure will be readily apparent from the following description of certain embodiments taken in conjunction with the accompanying drawings in which:

FIG. 8A shows a portion of a PCB that includes a PGS filter to mitigate RFI/EMI and cutouts below component pads to mitigate impedance discontinuities.

FIG. 8B illustrates a PCB that includes a dual-spiral common-mode filter that replaces the PGS filter and cutouts of FIG. 8A in accordance with some embodiments.

Figure 1A:
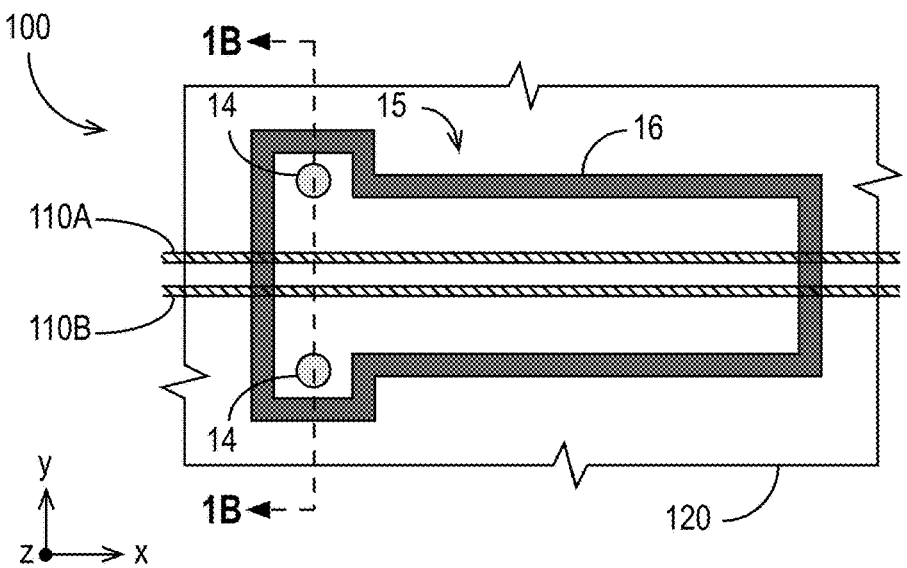
FIG. 1A illustrates a portion of a PCB that includes a common-mode filter that uses vias.

To facilitate understanding, identical reference numerals have been used, where possible, to designate identical elements that are common to the figures. It is contemplated that elements disclosed in one embodiment may be beneficially utilized in other embodiments without specific recitation. Moreover, the description of an element in the context of one drawing is applicable to other drawings illustrating that element.

DETAILED DESCRIPTION

In the following, reference is made to embodiments of the disclosure. It should be understood, however, that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim.

Common-mode noise filters can be used in electronic equipment (e.g., data storage devices, computers, etc.) to suppress common-mode noise and protect SNR. For example, signal detection electronics can include a filter circuit to filter common-mode noise. The inclusion of such a filter circuit, however, can increase the cost of the signal detection electronics. Alternatively, a common-mode filter using discrete components (e.g., capacitors, inductors, resistors, etc.) can be mounted on the surface of a PCB through which the signal paths are routed. In some applications, however, there may be insufficient room on the PCB for surface-mounted filters. Moreover, use of one or more surface-mounted filters increases the cost of the populated PCB. In addition, the bandwidth of this type of filter is usually narrow and can only target one frequency or one narrow frequency range at a time. Because a single filter may not provide sufficient attenuation of the common-mode noise, or may not provide sufficient attenuation at all frequencies at which common-mode noise is problematic (e.g., when the common-mode interference signals have a signal at a base frequency and higher harmonics), it may be necessary to use multiple common-mode filters to attenuate the common-mode noise adequately at the frequencies where it is problematic, thereby increasing the amount of space needed on the surface of the board when surface-mounted filters are used. Even when a single filter should be sufficient, manufacturing tolerances can cause the filter's frequency band to shift away from the target frequency band, which can reduce the effectiveness of the filter.

Another approach to mitigate common-mode noise is to add copper tape shielding to reduce EMI or RF interference to products that are susceptible to common-mode noise, but doing so adds manufacturing time and cost.

Therefore, the inclusion of one or more common-mode noise filters using one or more of the above-described approaches can increase the cost and/or size of the PCB and/or reduce the amount of PCB space available for other components.

Figure 1B:
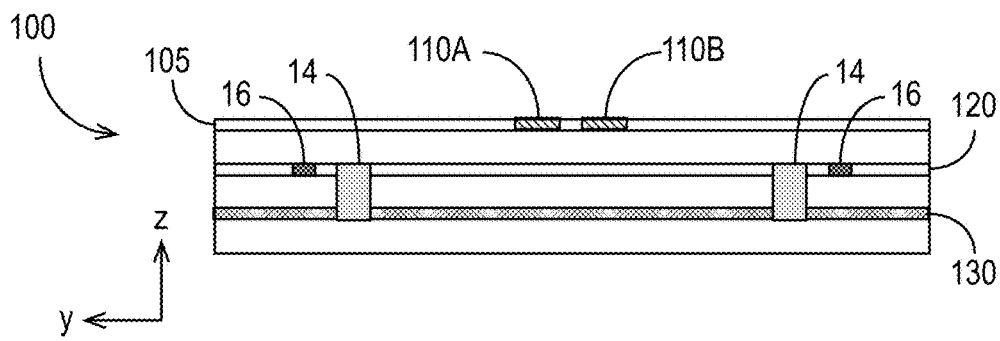
FIG. 1B is a cross-section view of the portion of the PCB at the location indicated in FIG. 1A.

An alternative approach is to build a common-mode noise filter into the PCB itself. FIG. 1A illustrates a portion of a PCB 100 that includes a common-mode filter 15. FIG. 1B is a cross-section view of the portion of the PCB 100 at the location indicated in FIG. 1A. FIGS. 1A and 1B (and other drawings herein) show only a portion of the PCB 100, but for simplicity, the portion of the PCB 100 described will be referred to generally in this document as "the PCB 100." It is to be understood that PCBs may take various forms, including rigid PCBs, flexible ("flex") PCBs, rigid-flex PCBs, high-frequency PCBs, and aluminum-backed PCBs.

For ease of explanation, a rectangular coordinate system is used to describe the orientation of the PCB 100 and its components, including the various common-mode filters described herein (e.g., in the context of FIGS. 1A and 1B, as well as in the context of other drawings described below). The component surfaces of the PCB 100 and the large surfaces of its layers are arbitrarily designated to be in the x-y plane. Thus, FIG. 1A illustrates the PCB 100 layers from above or below, viewed in the x-y plane of a rectangular coordinate system. In FIG. 1A, the z-axis extends out of the page, toward the reader. FIG. 1B illustrates a cross-section of the PCB 100 at the location indicated by the dashed line in FIG. 1A. As shown, the cross-section is in the y-z plane of the defined rectangular coordinate system.

As shown in FIGS. 1A and 1B, the common-mode filter 15 comprises a pair of vias 14 and a pattern 16 in the reference plane 120 (e.g., a ground plane) of the PCB 100. The common-mode filter 15 shown in FIGS. 1A and 1B is referred to in the art as a patterned ground structure (PGS) filter because the pattern 16 comprises gaps made (e.g., etched) in the reference plane 120 (e.g., a ground plane) of the PCB 100. FIG. 1A shows a "T-shaped" pattern 16, but this shape is merely exemplary.

For clarity of illustration, the pattern 16 is shown in FIG. 1A using a thick line. Thus, the presentation in FIG. 1A (and other similar figures herein) is similar to a negative of a photograph, in that the gaps making the pattern 16, which are areas in which material has been removed from the reference plane 120, are shown as darker lines, whereas the rest of the reference plane 120, from which material has not been removed, is shown without any shading. As explained above, the pattern 16 may be formed, for example, by etching the reference plane 120.

Signal traces 110A and 110B, which may support single-ended or differential signaling, are disposed in a signal trace layer 105 of the PCB 100, as shown in FIG. 1B. The signal trace layer 105 resides over the reference plane 120, and the signal traces 110A and 110B pass over the common-mode filter 15, as shown in FIGS. 1A and 1B. (It is to be understood that the signal trace layer 105 and the signal traces 110A and 110B could alternatively reside under the reference plane 120.) The signal traces 110A and 110B are offset from the reference plane 120 by some distance in the z-direction, as shown in FIG. 1B. Using the rectangular coordinate system established for FIGS. 1A and 1B, the signal traces 110A and 11B extend along or parallel to the x-axis.

FIG. 1B shows a cross-section view of the PCB 100 of FIG. 1A at the location indicated by the dashed line in FIG.

1A. FIG. 1B shows additional layers of the PCB 100, including the signal trace layer 105 in which the signal traces 110A and 110B reside, the reference plane 120 in which the pattern 16 is formed (e.g., etched), and the shield layer 130 to which the reference plane 120 is electrically connected by the vias 14. As is known in the art, a via is a small hole through a PCB that provides an electrical connection between different layers of a PCB. A via may be formed between two layers of a PCB by fabricating two pads in corresponding positions on the two layers of the PCB, and making a hole through the board between the two pads. The hole can be made conductive in any suitable way (e.g., by electroplating, by using a tube or rivet, etc.).

For clarity of illustration, the signal traces 110A and 110B are shown in isolation in FIG. 1A, and in other figures herein, without the rest of the signal trace layer 105 illustrated. Likewise, other layers that may be present in the PCB 100 are not specifically illustrated (e.g., in FIG. 1B) to avoid obscuring the elements of interest for the present discussion. Such other layers may include, for example, layers of copper foil, prepreg, and FR-4 laminate.

One issue with common-mode noise filters that use vias 14 (e.g., common-mode filter 15) is that the vias 14 consume space on the PCB. Although the need for vias 14 may not be an issue for larger PCBs, for smaller PCBs, even the small amount of space needed for the vias 14 may preclude the use of the common-mode filter 15 that has vias 14. Furthermore, the use of vias 14 may be impractical or impossible in other types of multi-layer metal circuits, such as, for example, integrated circuits (e.g., implemented in semiconductor chips). Thus, there is a need for common-mode filters that do not use vias 14 but that still provide the benefits of the common-mode filter 15, such as substantial suppression of common-mode noise in a selected frequency band or at a selected frequency without a substantial adverse effect on differential-mode signal transfer.

An alternative strategy is to use via-less common-mode filters, such as is disclosed in U.S. application Ser. No. 16/946,615, filed Jun. 29, 2020, and entitled "VIA-LESS PATTERNED GROUND STRUCTURE COMMON-MODE FILTER", which is hereby incorporated by reference in its entirety for all purposes. The disclosed via-less common-mode filters can be single-sided, partially-shielded, or fully-shielded. Whether single-sided, partially-shielded, or fully-shielded, they do not require any electrical connection to a shield layer, unlike the PGS filter 15 shown in FIGS. 1A and 1B.

Figure 1C:
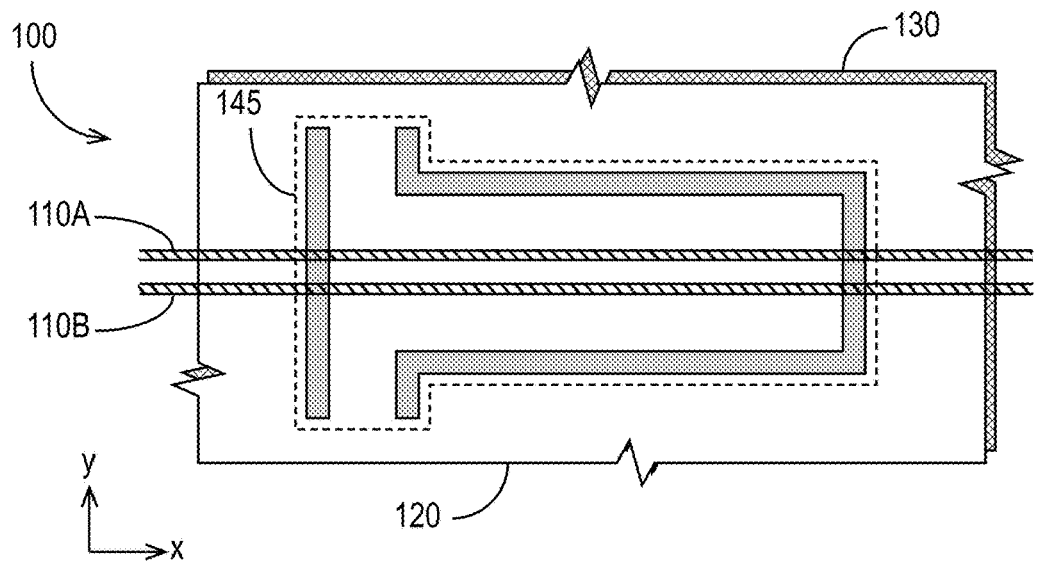
FIG. 1C illustrates an exemplary via-less common-mode filter.

FIG. 1C illustrates an exemplary via-less common-mode filter 145 that can be used instead of the PGS filter 15. Like the common-mode filter 15 of FIGS. 1A and 1B, the via-less common-mode filter 145 comprises a pattern that is formed (e.g., etched) in a reference plane 120 (e.g., a ground plane) of the PCB 100. Unlike the common-mode filter 15 of FIGS. 1A and 1B, however, the via-less common-mode filter 145 does not include any vias 14 connecting the via-less common-mode filter 145 to the shield layer 130. The via-less common-mode filter 145 shown in FIG. 1C is single-sided, with the shield layer 130 residing on the other side of the reference plane 120 from the signal traces 110A, 110B.

The exemplary via-less common-mode filter 145 uses a pattern that includes two disjoint (e.g., non-intersecting) sections. Both of the sections of the pattern are formed (e.g., etched) in the reference plane 120. Overall, the exemplary via-less common-mode filter 145 has the shape of the letter "T" and, therefore, is said to have a "T shape" in the x-y plane.

Signal traces 110A and 110B, which are disposed in a signal trace layer 105 of the PCB 100, pass over the via-less common-mode filter 145. (It is to be understood that the signal traces 110A and 110B could alternatively pass under the via-less common-mode filter 145, in which case the shield layer 130 would be above the reference plane 120.) As explained above, for clarity of illustration, the signal traces 110A and 110B are shown in isolation in FIG. 1C, without the rest of the signal trace layer 105 illustrated.

The via-less common-mode filter 145 eliminates the vias 14 used in the PGS filter 15 of FIGS. 1A and 1B and therefore offers advantages over the PGS filter 15, namely a more compact size. As explained in U.S. application Ser. No. 16/946,615, the length of the via-less common-mode filter 145 has a significant impact on the notch frequency. Accordingly, depending on the expected frequency of common-mode noise, the appropriate length of the via-less common-mode filter 145 may be larger than desired and/or it may be prohibitive. Thus, the availability of an even more compact via-less common-mode filter would be desirable. It would also be desirable to have a common-mode filter that does not require a shield layer 130.

Some PCBs include DC blocking capacitors in the signal path. These DC blocking capacitors may be fastened to the PCB via component pads (e.g., a small surface of copper in a PCB that provides mechanical support and allows components to be soldered to the PCB). DC blocking capacitors are common sources of impedance discontinuities in, for example, high-speed serial channels because the signal traces 110A, 110B, which typically have narrow width and narrow spacing, are routed into the component pads, which causes a widening of the signal traces, which causes an impedance discontinuity. The discontinuity manifests as excess capacitance because the component pads of the DC blocking capacitors act as a parallel plate with the reference plane 120. To reduce the excess parasitic capacitance associated with the DC blocking capacitors' component pads, a portion of the reference plane 120 directly beneath the component pads may be removed to form what may be referred to as a "cutout." The use of cutouts allows signals traversing through the DC blocking capacitors to reference a lower plane of the PCB, thereby reducing the parasitic capacitance and reducing the impedance mismatch. Cutouts may also be used to mitigate impedance mismatches caused by surface-mounted components other than DC blocking capacitors.

Figure 2:
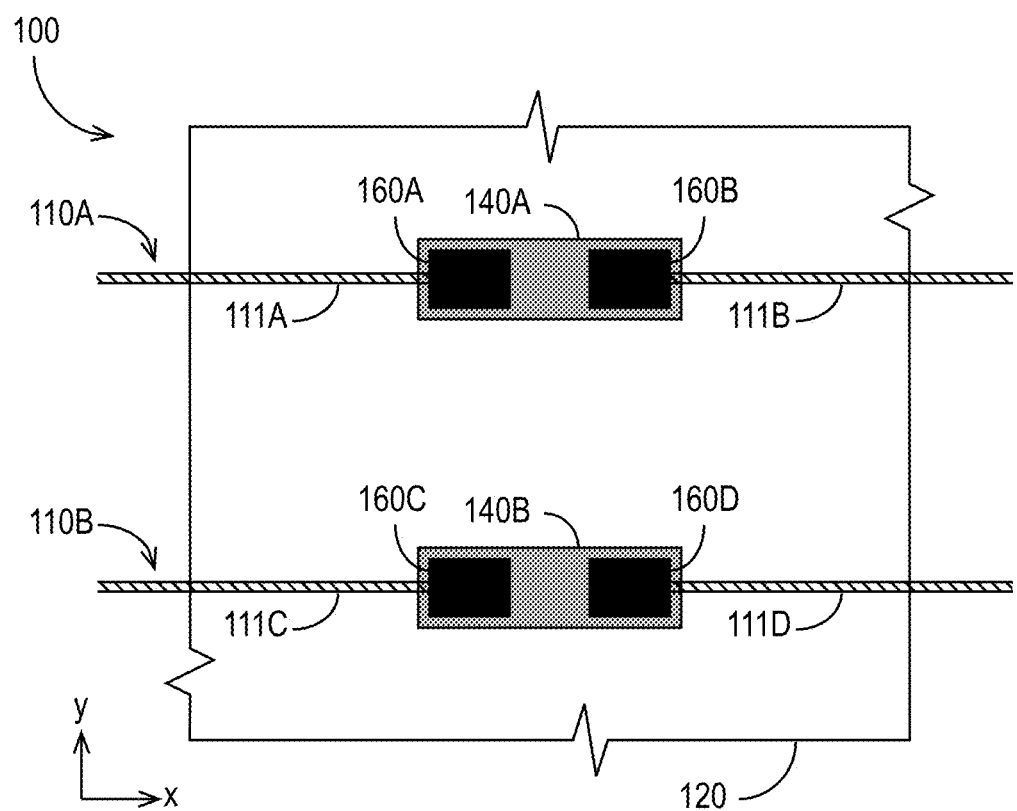
FIG. 2 shows a portion of a PCB that includes signal traces and cutouts below component pads.

An example of the use of component pads and cutouts is illustrated in FIG. 2. FIG. 2 shows a portion of a PCB 100 that includes signal traces 110A, 110B. The signal trace 110A has two portions, 111A and 111B. The portion 111A terminates in (or emanates from) the component pad 160A, and the portion 111B terminates in (or emanates from) the component pad 160B. A first DC blocking capacitor (not shown) or other component may be attached to the PCB 100 at the component pads 160A, 160B (e.g., by soldering one terminal of the DC blocking capacitor to the component pad 160A and the other terminal of the DC blocking capacitor to the component pad 160B), and thereby connect the first and second portions 111A, 111B of the signal trace 110A. As shown in FIG. 2, a cutout 140A in the reference plane 120 resides below (or above) the component pads 160A, 160B to mitigate the capacitive effect of the component pads 160A, 160B on the impedance.

Similarly, the signal trace 110B has two portions, 111C and 111D. The portion 111C terminates in the component pad 160C, and the portion 111D terminates in the component pad 160D. A second DC blocking capacitor (not shown) or other component may be attached to the PCB 100 at the component pads 160C, 160D (e.g., by soldering the terminals of the DC blocking capacitor to the component pads 160C, 160D), and thereby connect the first and second portions 111C, 111D of the signal trace 110B. As shown in FIG. 2, a cutout 140B in the reference plane 120 resides below (or above) the component pads 160C, 160D to mitigate the capacitive effect of the component pads 160C, 160D on the impedance.

The inventors of the present disclosure recognized that a new type of filter can provide RFI/EMI suppression as well as mitigation of the impedance mismatch caused by the component pads 160A, 160B, 160C, and 160D used to attach, e.g., DC blocking capacitors to the PCB. The new compact, via-less common-mode filter can replace the cutouts 140A, 140B and the separate PGS filter that is often included in PCBs to provide RFI/EMI suppression. As described further below, the new filter, which is patterned into the reference plane 120, has a dual-spiral shape and does not require a shield layer 130. When situated under the component pads used to attach DC blocking capacitors (or other components) to the PCB 100, the new filter not only mitigates RFI/EMI but, like the cutouts 140A, 140B, reduces the capacitive effect of the component pads 160A, 160B, 160C, 160D on the impedance. Because the new filter has a compact, dual-spiral shape and replaces both the cutouts 140A, 140B and conventional PGS filters, it can provide RFI/EMI suppression while mitigating impedance mismatches due to DC blocking capacitors (or other surface-mounted components) on smaller PCBs. Stated another way, a smaller PCB can be designed and, by including the new dual-spiral common-mode filter, can provide both adequate RFI/EMI suppression and impedance matching without the use of cutouts 140A, 140B or conventional PGS filters.

Figure 3A:
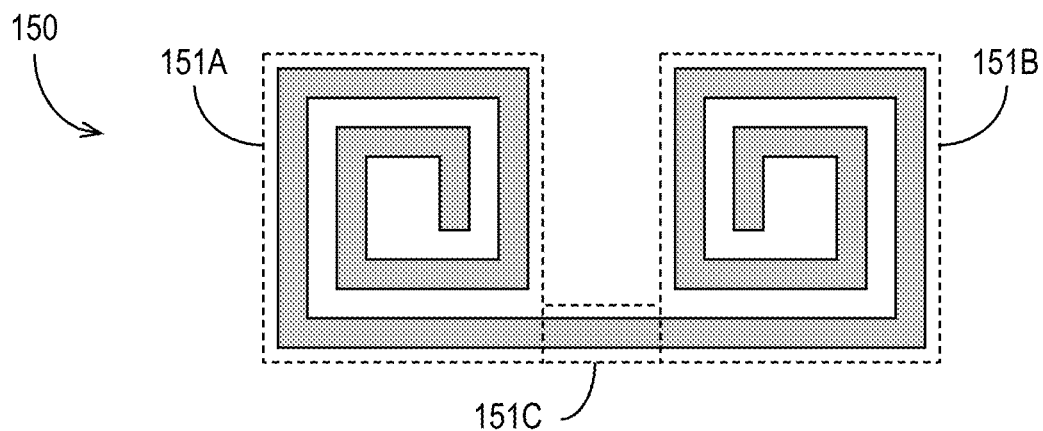
FIG. 3A is an illustration of an exemplary dual-spiral common-mode filter in accordance with some embodiments.

FIG. 3A is an illustration of an exemplary dual-spiral common-mode filter 150 in accordance with some embodiments. As shown, the dual-spiral common-mode filter 150 has a first spiral portion 151A and a second spiral portion 151B, connected together by a connector portion 151C. The dual-spiral common-mode filter 150 may be, for example, etched into the reference (ground) plane 120 of a PCB 100. The PCB 100 does not need to include a shield layer for the dual-spiral common-mode filter 150. In the example dual-spiral common-mode filter 150 shown in FIG. 3A, the first and second spiral portions 151A, 151B are approximate mirror images of each other.

Figure 3B:
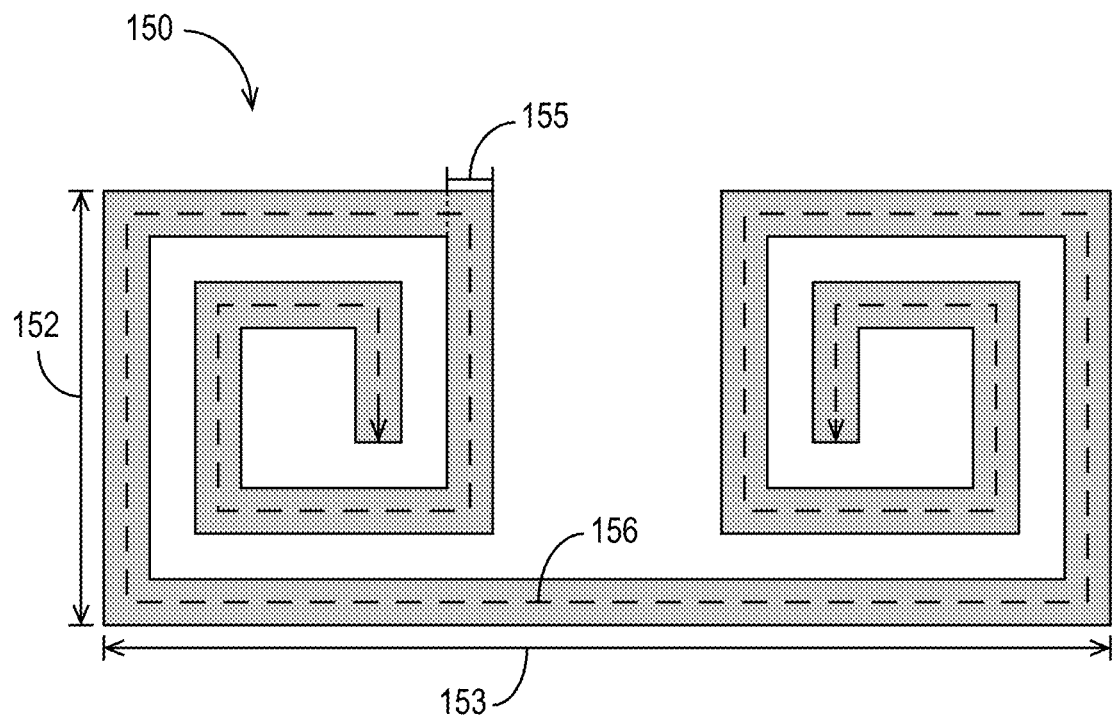
FIG. 3B is a closer view of the exemplary dual-spiral common-mode filter of FIG. 3A.

FIG. 3B is a closer view that illustrates various dimensions of the exemplary dual-spiral common-mode filter 150 of FIG. 3A. The exemplary dual-spiral common-mode filter 150 has a substantially rectangular shape, but this is not a requirement. A first dimension 152 of the dual-spiral common-mode filter 150 extends in a first direction, and a second dimension 153 of the dual-spiral common-mode filter 150 extends in a second direction that is approximately perpendicular to the first direction. (It is to be appreciated that the terms "first" and "second" are arbitrarily assigned in this context and are used merely to distinguish between two dimensions of the dual-spiral common-mode filter 150.) In the example of FIG. 3B, the first dimension 152 is smaller than the second dimension 153, but this is not a requirement. The second dimension 153, which includes the connector portion 151C in FIG. 3B, may be equal to or smaller than the first dimension 152.

The aspect ratio of the dual-spiral common-mode filter 150 is the ratio of the larger of the first and second dimensions 152, 153 to the smaller of the first and second dimensions 152, 153. The aspect ratio is equal to 1 if the first and second dimensions 152, 153 are the same. Referring to the exemplary dual-spiral common-mode filter 150 shown in FIG. 3B, because the second dimension 153 is larger than the first dimension 152, the aspect ratio of the illustrated example is the ratio of the second dimension 153 to the first dimension 152.

The dual-spiral common-mode filter 150 also has a pattern width 155 and an overall length 156. The overall length 156 is the length of the pattern if it were "uncoiled," that is, the end-to-end length of the pattern formed (e.g., etched) into the reference plane 120.

The first dimension 152, second dimension 153, pattern width 155, and overall length 156 of the dual-spiral common-mode filter 150 may have any suitable values to provide the dual-spiral common-mode filter 150 with the desired characteristics (e.g., RFI/EMI suppression of at least a specified number of dB at a target frequency or in a target frequency band). For example, for some applications in which RFI/EMI suppression of at least several dB is desirable at up to a few tens of GHz, the first dimension 152 may be between approximately 0.5 mm and approximately 1.5 mm, the second dimension may be between approximately 1.5 mm and approximately 3 mm, the pattern width 155 may be between approximately 0.05 mm and approximately 0.15 mm (e.g., 0.1 mm may be a suitable width in some applications), and the overall length 156 may be between approximately 10 mm and approximately 25 mm. As will be discussed further below, the overall length 156 plays a significant role in determining the characteristics (e.g., resonance frequency, notch frequency, etc.) of the dual-spiral common-mode filter 150.

Figure 4A:
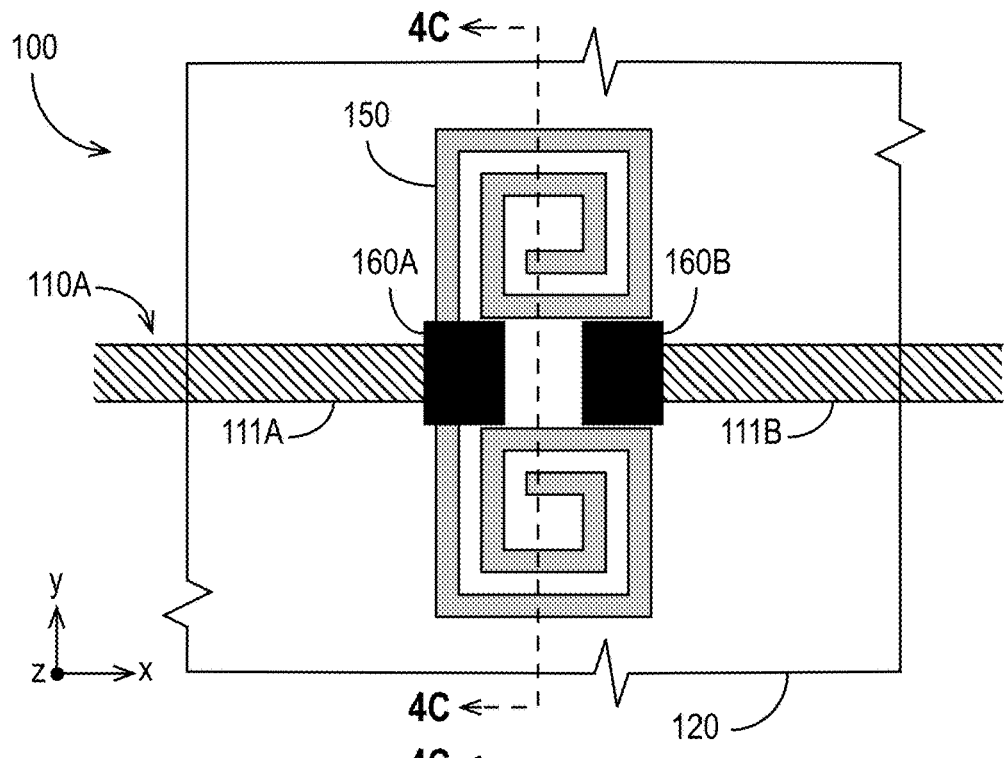
FIG. 4A illustrates a portion of a PCB that includes an exemplary dual-spiral common-mode filter in the reference plane in accordance with some embodiments.

FIG. 4A illustrates an exemplary portion of a PCB 100 with an exemplary dual-spiral common-mode filter 150 formed (e.g., etched) in the reference plane 120. The PCB 100 includes a signal trace 110A in a signal layer 105. The signal trace 110A has two portions, 111A and 111B. The portion 111A terminates in (or emanates from) the component pad 160A, and the portion 111B terminates in (or emanates from) the component pad 160B. A first DC blocking capacitor (not shown) or other component may be attached to the PCB 100 through the component pads 160A, 160B (e.g., by soldering), and thereby connect the first and second portions 111A, 111B of the signal trace 110A. The signal trace 110A may be, for example, a 50 ohm coplanar microstrip line, which may be, for example, about 0.5 mm wide. As shown in FIG. 4A, the reference plane 120 includes a dual-spiral common-mode filter 150, which is situated at least partially underneath the component pads 160A and 160B. In the illustrated example, the dual-spiral common-mode filter 150 has characteristics similar to those described in the discussion of FIGS. 3A and 3B. As discussed further below, other patterns and arrangements are possible, and the examples shown are not intended to be limiting.

It is to be understood that the elements of FIG. 4A are not necessarily to scale. For example, as explained above, the pattern width 155 may be around 0.1 mm, and the signal trace 110A may be around 0.5 mm wide. Therefore, the sizes of the signal trace 110A and the pattern width 155 of the dual-spiral common-mode filter 150 shown in FIG. 4A are not necessarily to scale relative to each other.

Figure 4B:
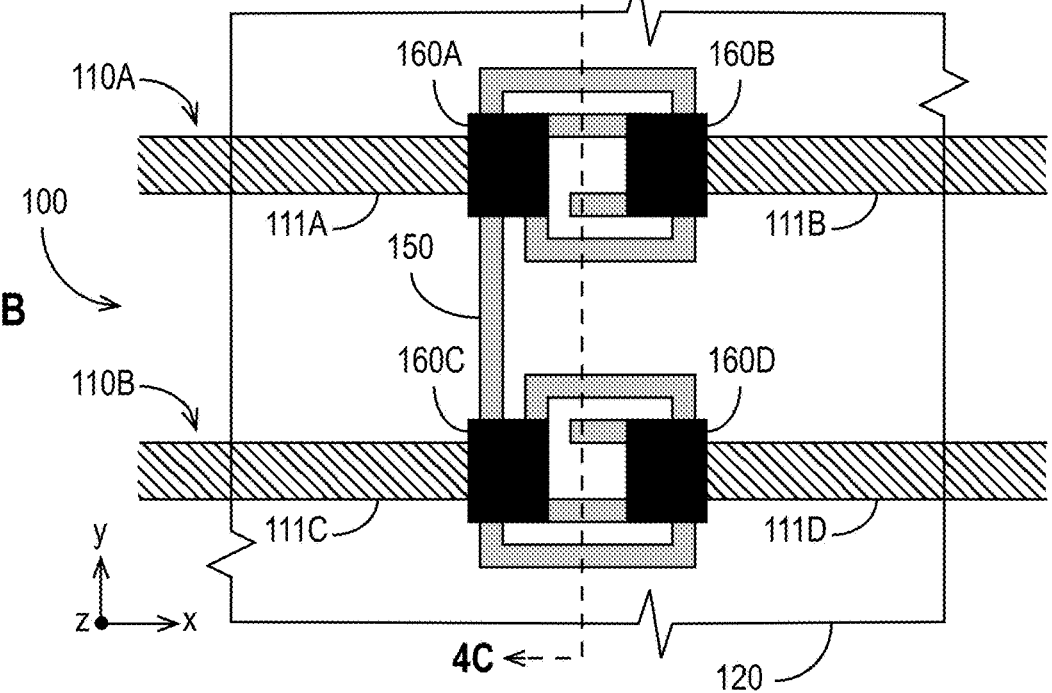
FIG. 4B illustrates a portion of another PCB that includes an exemplary dual-spiral common-mode filter in the reference plane in accordance with some embodiments.

FIG. 4B illustrates an exemplary portion of a PCB 100 with an exemplary dual-spiral common-mode filter 150 in the reference plane 120. In this example, the PCB 100 includes two signal traces 110A, 110B, which may provide for differential signaling. Each of the signal traces 110A, 110B may be, for example, a 50 ohm coplanar microstrip line, which may be, for example, 0.5 mm wide. The signal trace 110A has two portions, 111A and 111B. The portion 111A terminates in (or emanates from) the component pad 160A, and the portion 111B terminates in (or emanates from) the component pad 160B. A first DC blocking capacitor (not shown) or other component may be attached to the PCB 100 using the component pads 160A, 160B, and thereby connect the first and second portions 111A, 111B of the signal trace 110A. Similarly, the signal trace 110B has two portions, 111C and 111D. The portion 111C terminates in (or emanates from) the component pad 160C, and the portion 111D terminates in (or emanates from) the component pad 160D. A second DC blocking capacitor (not shown) or other component may be attached to the PCB 100 using the component pads 160C, 160D, and thereby connect the first and second portions 111C, 111D of the signal trace 110B.

As shown in FIG. 4B, the reference plane 120 includes a dual-spiral common-mode filter 150, which is situated at least partially underneath the component pads 160A, 160B, 160C, and 160D. The first and second signal traces 110A, 110B are situated over mirror-image portions of the dual-spiral common-mode filter 150, and the first and second signal traces 110A, 110B are situated symmetrically relative to the midpoint of the connector portion (labeled in FIG. 3A) of the dual-spiral common-mode filter 150. As in FIG. 4A, the elements of FIG. 4B are not necessarily to scale relative to each other.

Figure 4C:
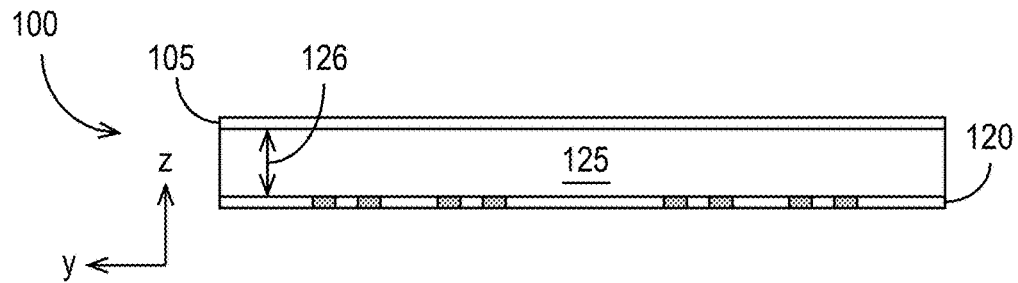
FIG. 4C is an illustration of the cross-section of each of the PCBs shown in FIGS. 4A and 4B.

FIG. 4C is an illustration of the cross-section of each of the PCBs 100 shown in FIGS. 4A and 4B at the location indicated in FIGS. 4A and 4B. The dual-spiral common-mode filter 150 is, as illustrated, patterned (e.g., etched) into the reference plane 120, which is separated from the signal plane 105 by a dielectric 125 (e.g., an insulating layer) of thickness 126. The thickness 126 may be, for example, between about 0.2 mm and about 0.3 mm (e.g., it may be approximately 0.25 mm).

Figure 5:
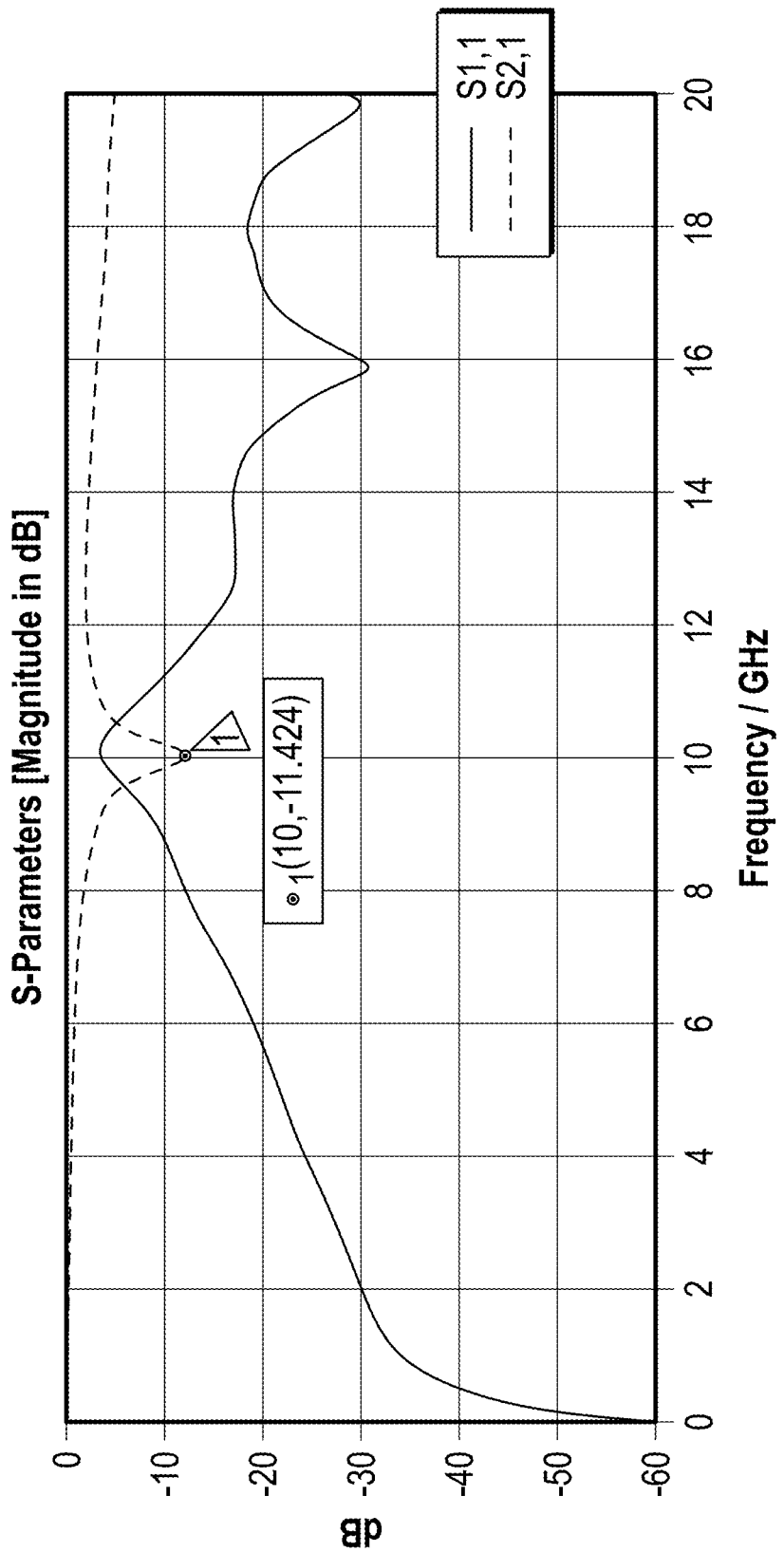
FIG. 5 illustrates the single-ended insertion loss and return loss (S-parameters) of the exemplary dual-spiral common-mode filter shown in FIG. 4A.

FIG. 5 illustrates the single-ended insertion loss and return loss (S-parameters) of the exemplary dual-spiral common-mode filter 150 of FIG. 4A, with the first dimension 152 having a value of approximately 1 mm, the second dimension 153 having a value of approximately 2.5 mm, and the pattern width 155 having a value of approximately 0.1 mm. As shown in FIG. 5, this exemplary dual-spiral common-mode filter 150 provides a notch of approximately 11.4 dB at a frequency of 10 GHz and, therefore, would be suitable to filter common-mode noise at a frequency of about 10 GHz.

As stated above, the overall length 156 of the dual-spiral common-mode filter 150 plays a significant role in determining the resonance frequency (or notch frequency) of the dual-spiral common-mode filter 150. The resonance frequency can be determined using the equation $$l_p = \frac{\pi}{\beta} = \frac{\pi}{\beta_0 \sqrt{\varepsilon_r}},$$

where $l_p$ is me length of the slot (half wavelength), and $\beta$ and $\beta_0$ are phase constants of the dielectric, and $\varepsilon_r$ is the relative permittivity. In typical PCB applications, depending on the resonance frequency, the value of $l_p$ (the overall length 156) may be relatively long. The dual-spiral shape of the dual-spiral common-mode filters 150 disclosed herein allows the value of $l_p$ (the overall length 156) to be long while still maintaining a compact filter shape.

Figure 6:
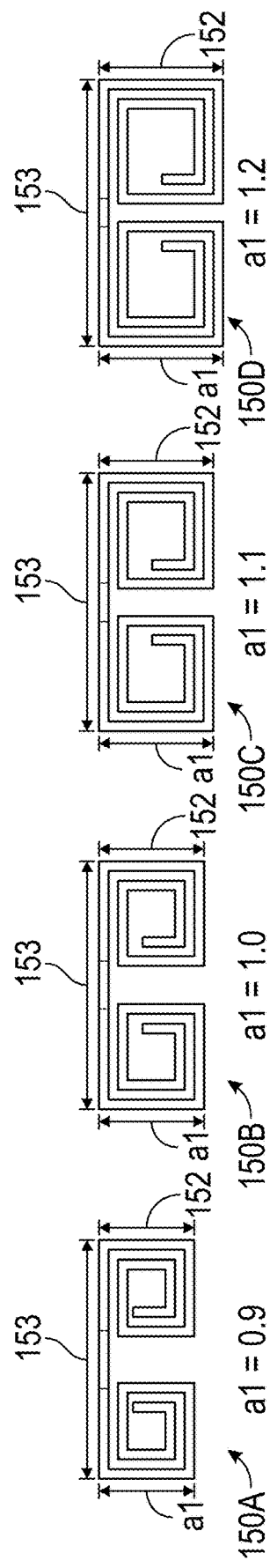
FIG. 6 illustrates four exemplary dual-spiral common-mode filters and their S-parameter magnitudes in accordance with some embodiments.
Figure 6:
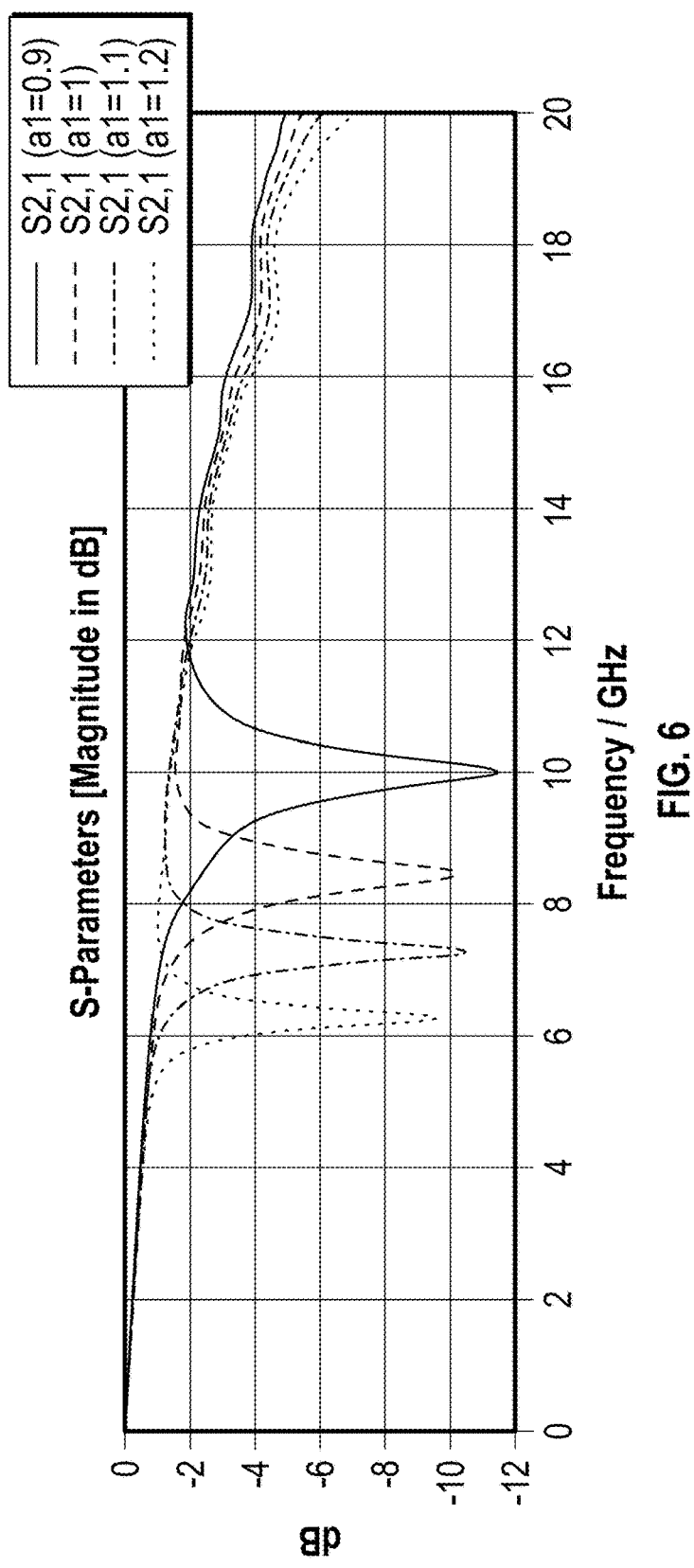

FIG. 6 illustrates four exemplary dual-spiral common-mode filters 150A, 150B, 150C, and 150D in accordance with some embodiments. As shown, the four dual-spiral common-mode filters 150A, 150B, 150C, and 150D have similar shapes, but they differ in size. Specifically, the first dimensions 152, second dimensions 153, and overall lengths 156 differ. The dual-spiral common-mode filter 150A has the smallest first dimension 152, second dimension 153, and overall length 156 (not labeled to avoid obscuring the drawing, but shown in the example illustrated in FIG. 3B). The dual-spiral common-mode filter 150D has the largest first dimension 152, second dimension 153, and overall length 156, and the dual-spiral common-mode filters 150B and 150C have, respectively, first dimensions 152, second dimensions 153, and overall lengths 156 between those of the dual-spiral common-mode filters 150A and 150D. As shown in the example of FIG. 6, the first dimension 152 (denoted as the parameter al) of the dual-spiral common-mode filter 150A is 0.9 mm, the first dimension 152 of the dual-spiral common-mode filter 150B is 1.0 mm, the first dimension 152 of the dual-spiral common-mode filter 150C is 1.1 mm, and the first dimension 152 of the dual-spiral common-mode filter 150D is 1.2 mm. The second dimensions 153 and overall lengths 156 also monotonically increase from the dual-spiral common-mode filter 150A to the dual-spiral common-mode filter 150D.

The plot shown in FIG. 6 illustrates how varying the dimensions of the dual-spiral common-mode filter 150 changes the magnitude of its S parameters. As the plot illustrates, increasing the first and second dimensions 152, 153 of the dual-spiral common-mode filter 150, the effect of which is to increase the filter overall length 156, decreases the notch frequency. For example, the dual-spiral common-mode filter 150A has a notch approximately 11.5 dB deep at a frequency of 10 GHz. The dual-spiral common-mode filter 150B has a notch approximately 10 dB deep at about 8.4 GHz. The dual-spiral common-mode filter 150C has a notch approximately 10.5 dB deep at about 7.2 GHz, and the dual-spiral common-mode filter 150D has a notch approximately 9.6 dB deep at about 6.2 GHz.

As will be appreciated by those having ordinary skill in the art, it is sometimes the case that the frequency at which RFI is expected to be problematic is known. FIG. 6 illustrates that the dimensions (e.g., first dimension 152, second dimension 153, pattern width 155, and overall length 156) of the dual-spiral common-mode filter 150 can be selected to provide a notch at a target frequency and depth. By selecting appropriate values for the dual-spiral common-mode filter 150's overall length 156, first dimension 152, second dimension 153, and pattern width 155, the filter 150's notch frequency and depth can be tuned to desired values.

Although FIG. 6 and other figures previously described herein illustrate exemplary dual-spiral common-mode filters 150 with specific shapes (e.g., having an overall substantially rectangular shape and with the portions 151A, 151B being substantially square in shape), there is no requirement for the dual-spiral common-mode filter 150 to have any particular shape. For example, one or both of the portions 151A, 151B could be circular, trapezoidal, or any other suitable shape that fits within the available PCB area. Furthermore, although some of the drawings herein illustrate exemplary dual-spiral common-mode filters 150 having similar-shaped portions 151A, 151B, there is no requirement for the portions 151A, 151B to have similar or the same shapes. For example, although FIGS. 3A, 3B, 4A, 4B, and 6 illustrate portions 151A, 151B that are mirror images of each other, the portions 151A, 151B are not required to be mirror images.

In addition, as explained in the context of FIG. 6, the dual-spiral common-mode filter overall length 156 substantially influences the dual-spiral common-mode filter 150's characteristics, but the layout of the dual-spiral common-mode filter 150 is not critical. Moreover, although FIG. 6 and other figures herein show dual-spiral common-mode filters 150 in which the spirals making up the portions 151A, 151B are in opposite directions (e.g., in FIG. 3A, if the spiral of the portion 151A is taken to be in the clockwise direction, the spiral of the portion 151B is in the counterclockwise direction), there is no requirement for the spirals in the portions 151A, 151B to be in opposite directions.

Figure 7A:
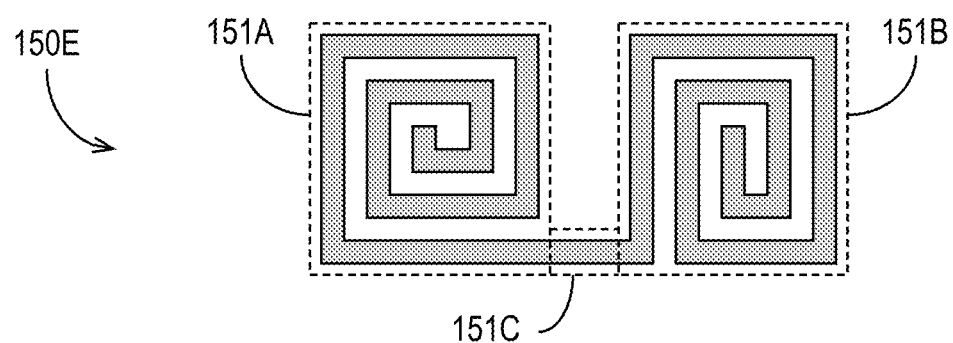
FIGS. 7A and 7B show exemplary alternative arrangements for dual-spiral common-mode filters in accordance with some embodiments.
Figure 7B:
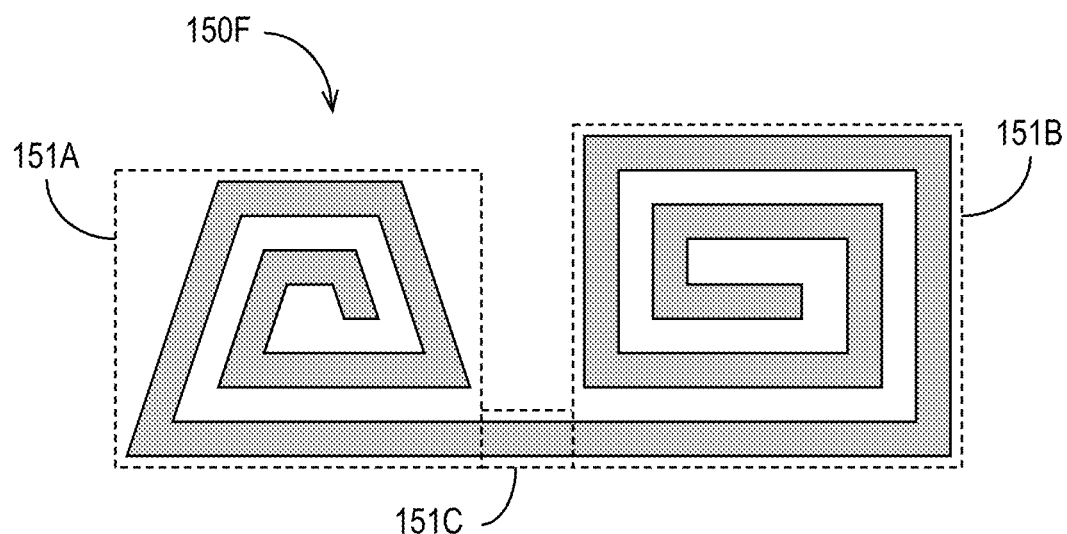

To illustrate that the portions 151A, 151B can be different and/or not mirror images of each other, FIGS. 7A and 7B show exemplary alternative arrangements for the dual-spiral common-mode filter 150 in accordance with some embodiments. FIG. 7A illustrates an exemplary dual-spiral common-mode filter 150E that includes a first spiral portion 151A, a second spiral portion 151B, and a connecting portion 151C. The spiral portions 151A and 151B are both rectangular-shaped, and both spirals are in the same direction, but the patterns of the two portions 151A, 151B differ.

FIG. 7B illustrates an exemplary dual-spiral common-mode filter 150F that includes a first spiral portion 151A, a second spiral portion 151B, and a connecting portion 151C. The first spiral portion 151A has a substantially trapezoidal shape, and the second spiral portion 151B has a rectangular shape. The directions of the spirals of the portions 151A, 151B are opposite. Thus, as illustrated by FIGS. 7A and 7B, the dual-spiral common-mode filter 150 can have different-shaped and/or different-patterned portions 151A, 151B, and/or the spirals of the portions 151A, 151B can be in opposite directions (e.g., one clockwise and one counterclockwise) or in the same direction (e.g., both clockwise or both counterclockwise).

FIGS. 8A and 8B illustrate how a dual-spiral common-mode filter 150 (including any of the exemplary dual-spiral common-mode filters 150A, 150B, 150C, 150D, 150E, and 150F disclosed herein) can be incorporated into a PCB 100 to replace both a conventional PGS filter and reference plane cutouts, in accordance with some embodiments. FIG. 8A shows a portion of a PCB 100A that includes cutouts 140A, 140B below component pads 160A, 160B, 160C, and 160D. The PCB 100A also includes a conventional L-shaped PGS filter 17 residing under the signal traces 110A, 110B at some distance from the component pads 160A, 160B, 160C, and 160D. As shown, the PGS filter 17 is 2.95 mm long. This length allows the PGS filter 17 to provide a notch at some frequency at which RFI is expected to be problematic.

FIG. 8B illustrates a PCB 100B that includes a dual-spiral common-mode filter 150 instead of both the PGS filter 17 and the cutouts 140A, 140B in accordance with some embodiments. In the example of FIG. 8B, the dual-spiral common-mode filter 150 is situated at least partially under each of the component pads 160A, 160B, 160C, and 160D. As shown in FIG. 8B, the exemplary dual-spiral common-mode filter 150 has a second dimension 153 of 1.5 mm. Because the dual-spiral common-mode filter 150 replaces both the PGS filter 17 and the cutouts 140A, 140B of FIG. 8A, it introduces the possibility for the size of the PCB 100B to be reduced (e.g., by at least the length of the PGS filter 17). For example, the signal traces 110A, 110B in the PCB 100B no longer need to extend over the PGS filter 17 included in the PCB 100A of FIG. 8A, thereby allowing the PCB 100B to be smaller than the PCB 100A. As discussed further below in the discussion of FIGS. 9, 10A, and 10B, the dual-spiral common-mode filter 150 of FIG. 8B can replace both the PGS filter 17 and cutouts 140A, 140B of FIG. 8A without sacrificing performance.

Figure 9:
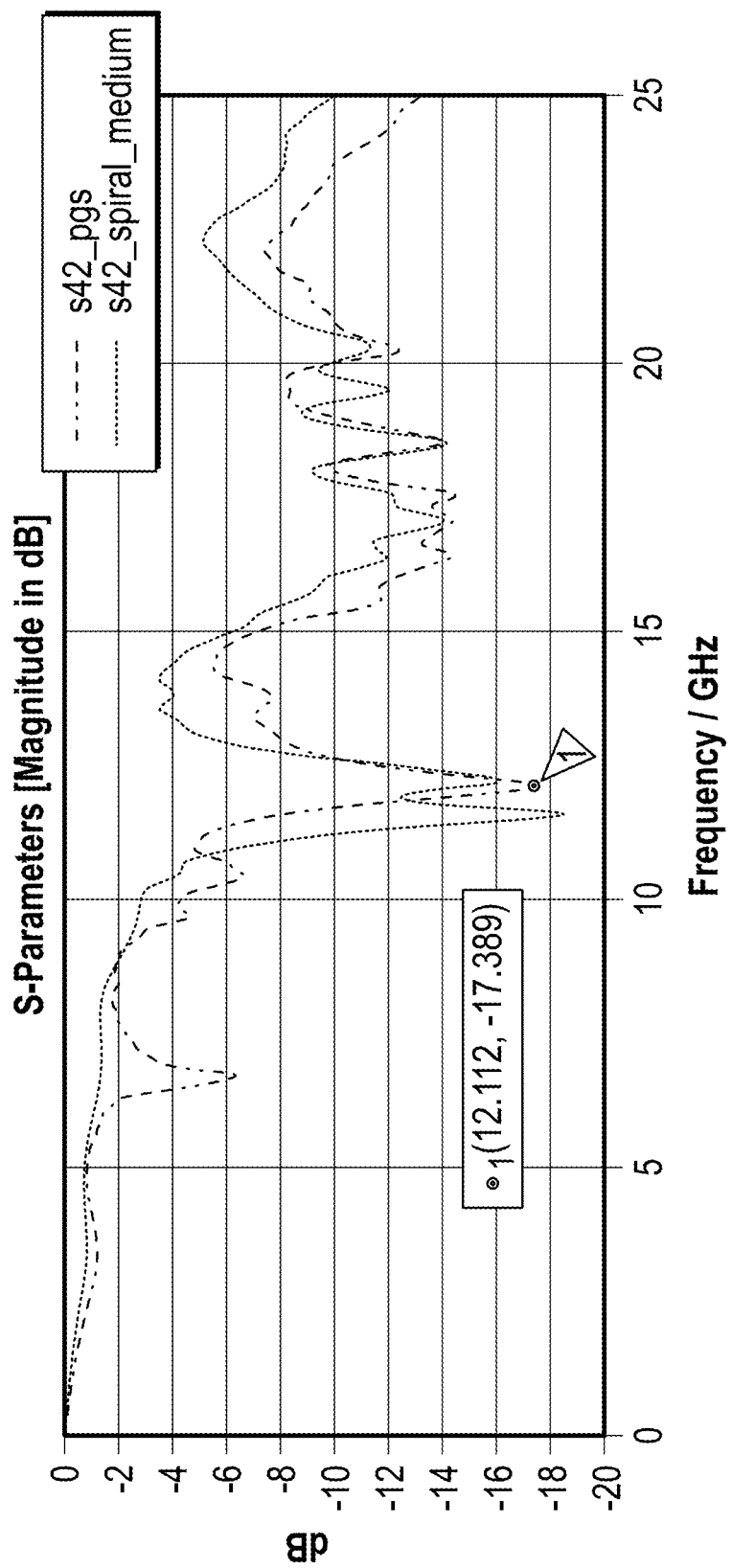
FIG. 9 compares the S-parameter magnitudes of the exemplary dual-spiral common-mode filter shown in FIG. 8B and the exemplary PGS filter shown in FIG. 8A.

FIG. 9 compares the S-parameter magnitude of the dual-spiral common-mode filter 150 shown in FIG. 8B to that of the PGS filter 17 shown in FIG. 8A. As FIG. 9 illustrates, the dual-spiral common-mode filter 150 provides attenuation over a wider frequency band than the PGS filter 17. For example, the dual-spiral common-mode filter 150 provides at least 10 dB of attenuation between approximately 11.2 GHz and 12.5 GHz, whereas the PGS filter 17 provides at least 10 dB of attenuation between only about 11.8 GHz and 12.5 GHz. Furthermore, the dual-spiral common-mode filter 150 has a deeper maximum attenuation than the PGS filter 17. As shown in FIG. 9, the dual-spiral common-mode filter 150 provides a maximum attenuation of over 18 dB as compared to the maximum attenuation of 17.4 dB provided by the PGS filter 17. In addition, the dual-spiral common-mode filter 150 has less resonance than the PGS filter 17 at frequencies below the stop band. For example, whereas the PGS filter 17 has a 6-dB notch between 6 and 7 GHz, the S-parameter magnitude (insertion gain) of the dual-spiral common-mode filter 150 is relatively flat below the stop band.

Figure 10A:
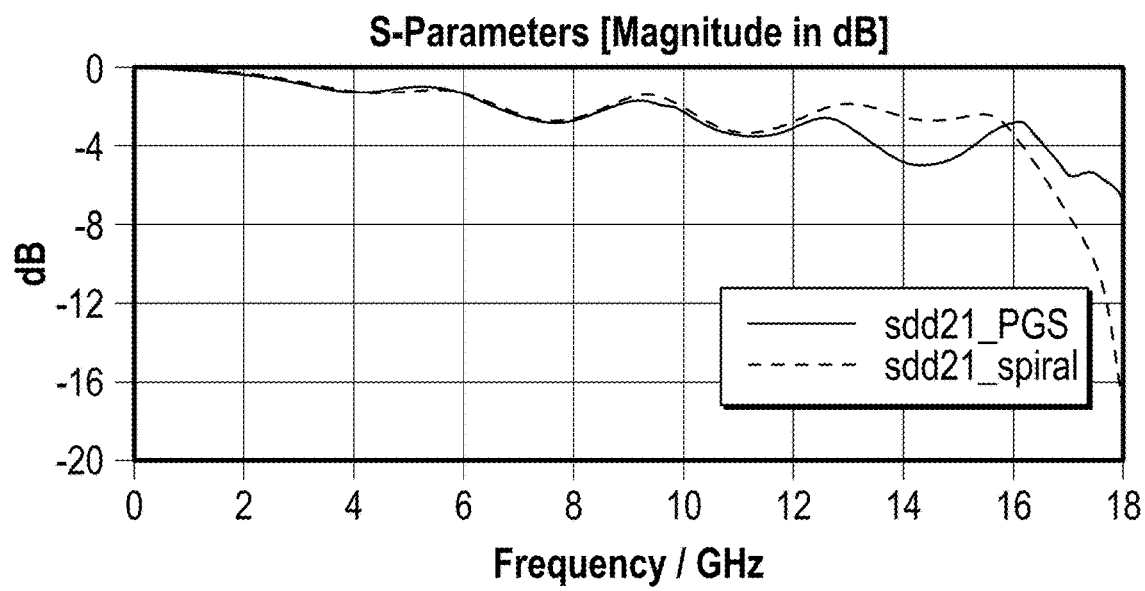
FIGS. 10A and 10B illustrate the impact on differential signal integrity of an exemplary dual-spiral common-mode filter relative to an exemplary the PGS filter.
Figure 10B:
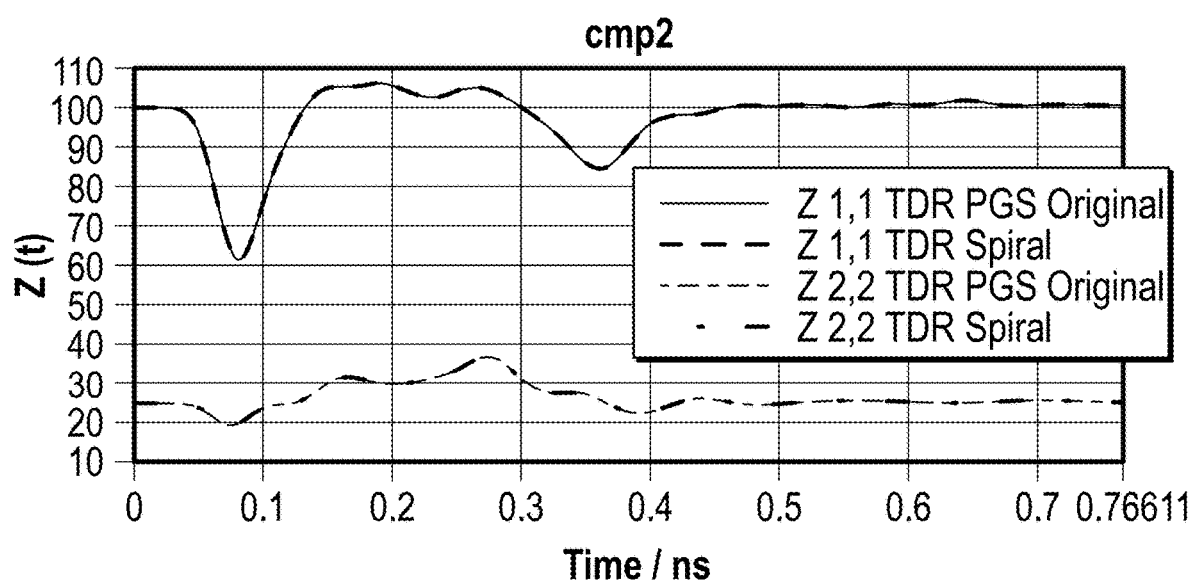

As explained above, the cutouts 140A, 140B are used in PCBs 100 to provide impedance matching. FIGS. 10A and 10B compare the impact on differential signal integrity of the dual-spiral common-mode filter 150 to that of the PGS filter 17. As shown in FIG. 10A, the S-parameter magnitudes of the dual-spiral common-mode filter 150 and the PGS filter 17 are approximately the same below 12 GHz. Between 12 GHz and about 16 GHz, the dual-spiral common-mode filter 150 provides an improvement relative to the PGS filter 17, including that the insertion loss is lower. Moreover, as explained in the discussion of FIG. 9, the dual-spiral common-mode filter 150 provides additional advantages, including attenuation over a wider frequency band.

FIG. 10B compares single-ended and differential time-domain reflectometer traces for the dual-spiral common-mode filter 150 (FIG. 8B) and the PGS filter 17 plus cutouts 140A, 140B (FIG. 8A). As shown, the traces are indistinguishable, which indicates that the dual-spiral common-mode filter 150 provides substantially the same the impedance matching as the PGS filter 17 plus cutouts 140A, 140B.

Accordingly, FIGS. 9, 10A, and 10B demonstrate that the dual-spiral common-mode filter 150 shown in FIG. 8B can replace both the PGS filter 17 and the cutouts 140A, 140B shown in FIG. 8A, and thereby allow the size of the PCB 100 to be reduced, without any significant degradation in performance and, in some respects, providing improved performance. Thus, the dual-spiral common-mode filter 150 is a compact common-mode filter (e.g., with a second dimension 153 less than or equal to about 2.5 mm to mitigate RFI/EMI around and below about 12 GHz) that does not require vias or the use of partial or full shield layers. The dual-spiral common-mode filter 150 can be etched on a reference plane 120 of the PCB 100. The dual-spiral common-mode filter 150 can be positioned below (or above) component pads 160A, 160B, etc. (e.g., used to attach DC blocking capacitors or any other components to the PCB 100). Cutouts (e.g., 140A, 140B) below (or above) the component pads 160A, 160B, etc. can be replaced by any of the disclosed dual-spiral common-mode filters 150, 150A, 150B, 150C, 150D, 150E, 150F (or similar dual-spiral common-mode filters 150, as described herein) to mitigate return path discontinuities and, at the same time, provide a controlled line impedance. Moreover, positioning a dual-spiral common-mode filter 150, 150A, 150B, etc. under (or over) component pads 160A, 160B reduces layout space requirements and thereby allows the size of the PCB 100 to be reduced.

It is to be understood that although one of the benefits of the disclosed dual-spiral common-mode filters 150, 150A, 150B, etc. is that they can replace both conventional PGS filters 17 and cutouts 140A, 140B, there is no requirement to do so. The disclosed dual-spiral common-mode filters 150, 150A, 150B, etc. may be used in addition to or instead of PGS filters 17. Similarly, the disclosed dual-spiral common-mode filters 150, 150A, 150B, etc. may be used in addition to or instead of cutouts 140A, 140B.

It is also to be understood that although various drawings herein show dual-spiral common-mode filters 150 with a particular orientation relative to one or more signal traces 110A, 110B (namely, with the first dimension 152 parallel to the direction in which the signal traces 110A, 110B extend), the orientation of the dual-spiral common-mode filter 150 relative to the signal traces 110A, 110B can be different than shown in the examples. As just one example, the dual-spiral common-mode filter 150 can be rotated 90 degrees so that the second dimension 153 is parallel to the direction in which the signal traces 110A, 110B extend. Similarly, the dual-spiral common-mode filter 150 can be rotated by more or less than 90 degrees. There is no requirement for the signal traces 110A, 110B to extend over similar or mirror-image portions of the dual-spiral common-mode filter 150, nor is there any requirement for the signal traces 110A, 110B to be oriented symmetrically with respect to a midpoint of the dual-spiral common-mode filter 150.

Figure 11:
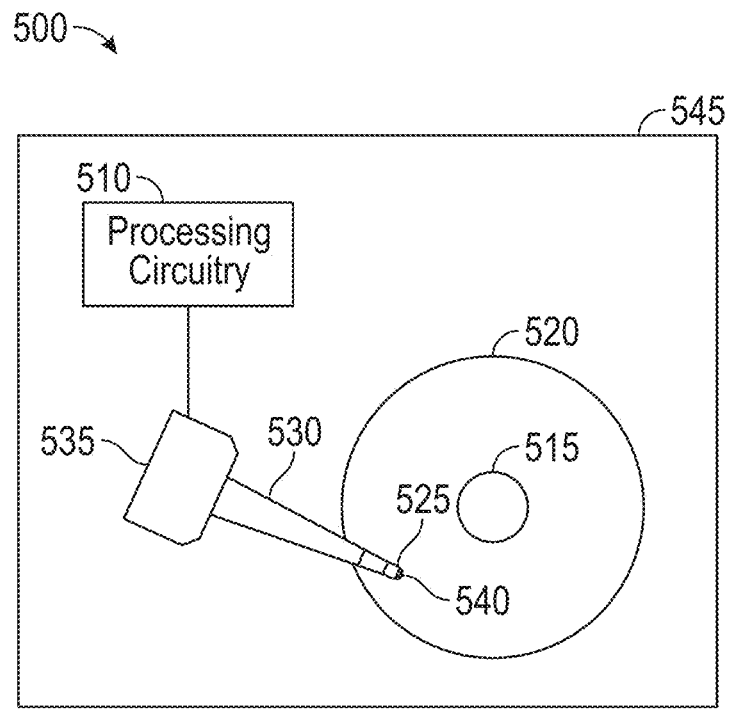
FIG. 11 illustrates several components of an exemplary data storage device that may include some embodiments of the dual-spiral common-mode filters and PCBs disclosed herein.

FIG. 11 illustrates several components of an exemplary data storage device 500 (e.g., a magnetic hard disk drive) that may include embodiments of the dual-spiral common-mode filters and PCBs disclosed herein. It is to be understood that the illustrated data storage device 500 is an example only. In addition to hard disk drives, other examples of data storage devices that may benefit from the disclosed dual-spiral common-mode filters 150 include solid-state drives and tape drives. Furthermore, PCBs with the inventive features can be generally used in any electronic device in which mitigation of RFI/EMI and/or the reduction of common-mode noise is desirable, and/or when elimination of cutouts (e.g., under DC blocking capacitors) is advantageous.

The data storage device 500 includes a spindle 515 that supports and rotates a magnetic disk 520. The spindle 515 is rotated by a spindle motor (not shown) that is controlled by a motor controller (not shown) that may be implemented in electronics of the data storage device 500. A slider 525, which is supported by a suspension and actuator arm 530, includes a combined read and write magnetic head 540. An actuator 535 rotatably positions the suspension and actuator arm 530 over the magnetic disk 520. The components of the data storage device 500 may be mounted on a housing 545. It is to be understood that although FIG. 11 illustrates a single disk 520, a single slider 525, a single head 540, and a single suspension and actuator arm 530, data storage device 500 may include a plurality (i.e., more than one) of disks 520, sliders 525, heads 540, and suspension and actuator arms 530.

The slider 525 has a gas-bearing surface that faces the surface of the disk 520 and counteracts a preload bias that pushes the slider toward the disk 520. For convenience, in this document the gas-bearing surface is referred to as the air-bearing surface (ABS) and the gas is generally referred to as "air," although it is to be understood that the gas used in a data storage device 500 may be a gas other than air (e.g., the gas may be helium). For simplicity, throughout this disclosure, the surface of the slider 525 that faces or that will eventually face the disk 520 is referred to as the ABS.

As the disk 520 rotates, the disk 520 drags air under the slider 525 and along the ABS in a direction approximately parallel to the tangential velocity of the disk 520. As the air passes under the ABS, air compression along the air flow path causes the air pressure between the disk 520 and the ABS to increase, which creates a hydrodynamic lifting force that counteracts the tendency of the suspension and actuator arm 530 to push the slider 525 toward the disk 520. The slider 525 thus flies above the disk 520 but in close proximity to the surface of the disk 520.

In operation, the actuator 535 moves the suspension and actuator arm 530 to position the slider 525 so that the magnetic head 540 is in a transducing relationship with the surface of the magnetic disk 520. The head 540 may be used to write information to one or more tracks on the surface of the disk 520 and to read previously-recorded information from the tracks on the surface of the disk 520. Processing circuitry 510 provides to the head 540 signals representing information to be written to the disk 520 and receives from the head 540 signals representing information read from the disk 520. The processing circuitry 510 also provides signals to the spindle motor to rotate the magnetic disk 520, and to the actuator 535 to move the slider 525 to various tracks.

For writing, the head 540 may use a single pole writer that has a main pole surrounded by magnetic shield materials. The main pole is typically separated from the magnetic shield materials by a non-magnetic spacer. The main pole may have a tapered shape with a tip that faces the magnetic recording media and is part of the ABS. The single pole writer may include a conductive coil encircling the writer pole in a helical or pancake like configuration.

To write to the disk 520, the slider 525 passes over a region of the disk 520, and an electric current is applied through the coil of the head 540, which causes a large magnetic field to be generated from the main pole tip. The polarity of the generated field causes a region of the magnetic disk 520 to assume a polarity, thus enabling information to be stored on the disk 520.

To read information from the disk 520, the head 540 may include only one read sensor, or it may include multiple read sensors. The read sensor(s) in the head 540 may include, for example, one or more giant magnetoresistance (GMR) sensors, tunneling magnetoresistance (TMR) sensors, or another type of magnetoresistive sensor. When the slider 525 passes over a region of the disk 520, the head 540 detects changes in resistance due to magnetic field variations recorded on the disk 520, which represent the recorded bits.

Figure 12:
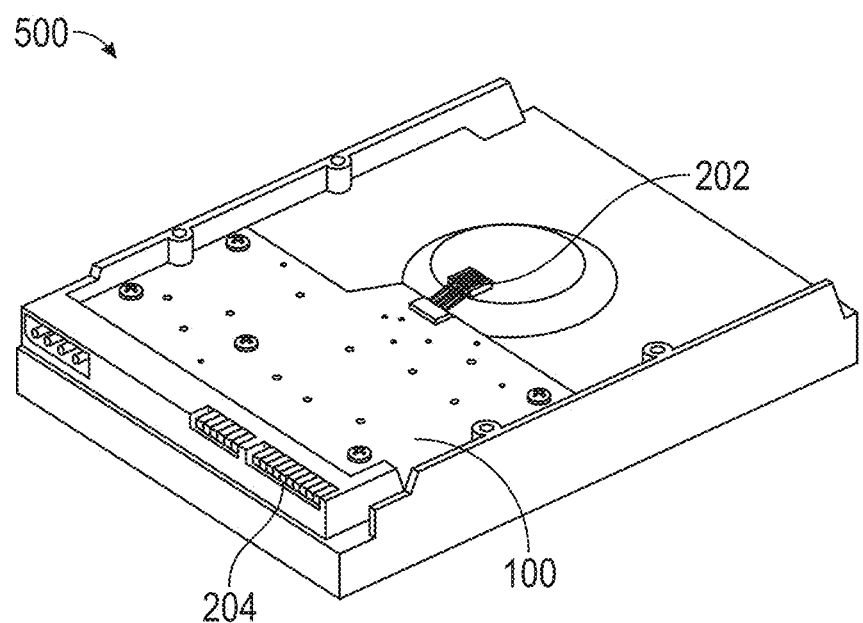
FIG. 12 is a schematic bottom illustration of a data storage device including a PCB in accordance with some embodiments.

FIG. 12 is a schematic bottom illustration of a data storage device 500 including a PCB 100 in accordance with some embodiments. The PCB 100 has electrical connections 202 to other components of the data storage device 500 and electrical connections 204 to be used to connect the data storage device 500 to a device (e.g., a computer) that will use the data storage device 500.

Data storage devices 500 (e.g., hard disk drives) utilize serial interface input/output electrical lines, and the serial attached small (SAS) computer-system interface, which may inherently generate common-mode interference signals at frequencies that are multiples of 6 GHz, i.e., 6 GHz, 12 GHz, 18 GHz, and 24 GHz at SAS trace. As explained above, conventional solutions to filter out such common-mode interference signals suffer from various deficiencies, such as not providing sufficient notch depths at the affected frequencies, or being too large and/or too numerous to fit on the surface of a PCB. The dual-spiral common-mode filters and PCBs disclosed herein provide solutions to these deficiencies.

Figure 13:
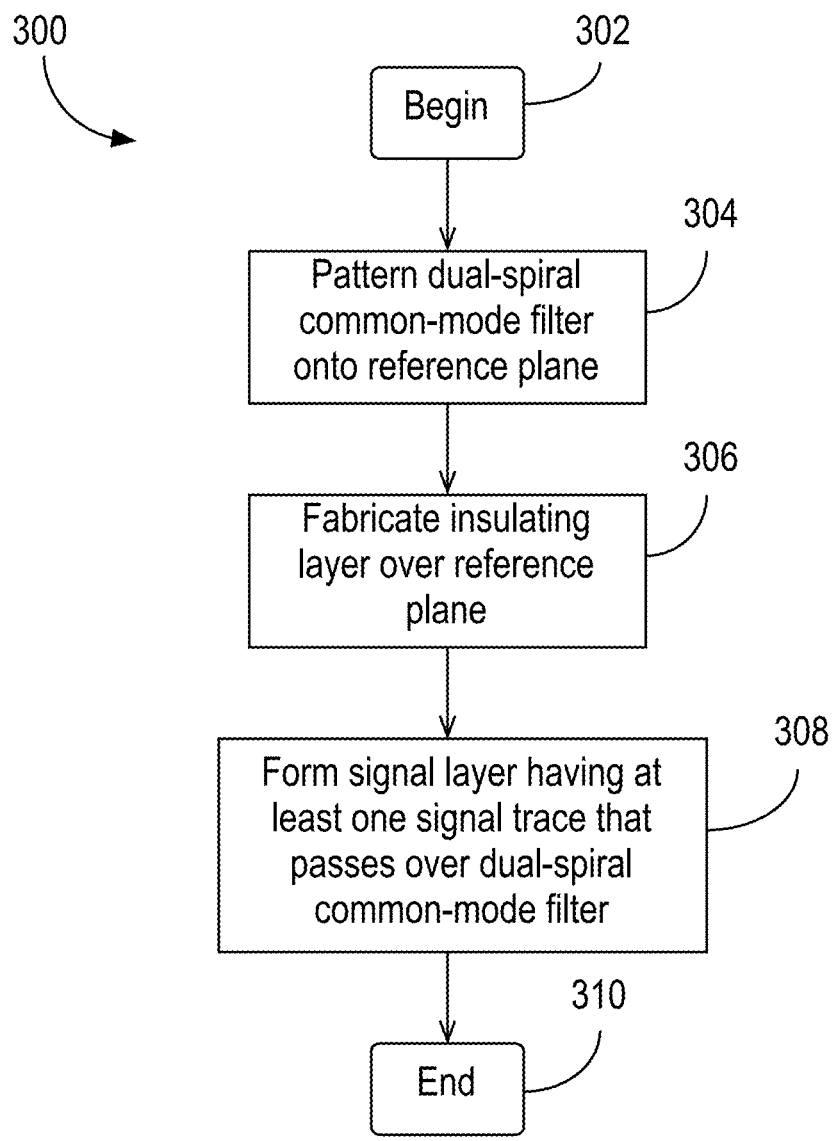
FIG. 13 is a flow diagram illustrating a method of fabricating a PCB having a dual-spiral common-mode filter in accordance with some embodiments.

FIG. 13 is a flow diagram illustrating a method 300 of fabricating a PCB having a dual-spiral common-mode filter in accordance with some embodiments. At 302, the method 300 begins. At 304, a dual-spiral common-mode filter is patterned onto a reference plane. As discussed above in the context of other drawings, the dual-spiral common-mode filter may have, for example, a first spiral portion connected to a second spiral portion (e.g., through a connector portion). The directions of the first and second spirals (e.g., clockwise, counterclockwise) may be the same or different (e.g., opposite). At 306, an insulating (e.g., dielectric) layer is fabricated over the reference plane. At 308, a signal layer having at least one signal trace is fabricated. The at least one signal trace passes over the dual-spiral common-mode filter. In some embodiments, the signal layer also has first and second component pads, and the at least one signal trace comprises a first portion terminating in (or emanating from) the first component pad and a second portion terminating in (or emanating from) the second component pad, as described above in the discussion of FIGS. 4A and 4B. In some embodiments, the first and second component pads are situated at least partially over the dual-spiral common-mode filter. At 310, the method 300 ends.

In the foregoing description and in the accompanying drawings, specific terminology has been set forth to provide a thorough understanding of the disclosed embodiments. In some instances, the terminology or drawings may imply specific details that are not required to practice the invention.

To avoid obscuring the present disclosure unnecessarily, well-known components are shown in block diagram form and/or are not discussed in detail or, in some cases, at all.

Unless otherwise specifically defined herein, all terms are to be given their broadest possible interpretation, including meanings implied from the specification and drawings and meanings understood by those skilled in the art and/or as defined in dictionaries, treatises, etc. As set forth explicitly herein, some terms may not comport with their ordinary or customary meanings.

As used in the specification and the appended claims, the singular forms "a," "an" and "the" do not exclude plural referents unless otherwise specified. The word "or" is to be interpreted as inclusive unless otherwise specified. Thus, the phrase "A or B" is to be interpreted as meaning all of the following: "both A and B," "A but not B," and "B but not A." Any use of "and/or" herein does not mean that the word "or" alone connotes exclusivity.

As used in the specification and the appended claims, phrases of the form "at least one of A, B, and C," "at least one of A, B, or C," "one or more of A, B, or C," and "one or more of A, B, and C" are interchangeable, and each encompasses all of the following meanings: "A only," "B only," "C only," "A and B but not C," "A and C but not B," "B and C but not A," and "all of A, B, and C."

To the extent that the terms "include(s)," "having," "has," "with," and variants thereof are used in the detailed description or the claims, such terms are intended to be inclusive in a manner similar to the term "comprising," i.e., meaning "including but not limited to."

The terms "exemplary" and "embodiment" are used to express examples, not preferences or requirements.

The term "coupled" is used herein to express a direct connection/attachment as well as a connection/attachment through one or more intervening elements or structures.

The terms "over," "under," "between," and "on" are used herein refer to a relative position of one feature with respect to other features. For example, one feature disposed "over" or "under" another feature may be directly in contact with the other feature or may have intervening material. Moreover, one feature disposed "between" two features may be directly in contact with the two features or may have one or more intervening features or materials. In contrast, a first feature "on" a second feature is in contact with that second feature.

It is to be understood that when a first feature of a PCB (e.g., a layer, a filter, a cutout, etc.) is said to be "under" a second feature of the PCB (e.g., a layer, a component pad, a signal trace, etc.), the first feature is also "over" the second feature when the PCB is turned over (e.g., rotated by 180 degrees). For example, the description herein refers at times to the signal plane 105 as being "above" or "over" the reference plane 120, but it is to be understood that the relative positions of the signal plane 105 and reference plane 120 can be modified by simply rotating the PCB.

The terms "substantially" and "approximately" are used to describe a structure, configuration, dimension, etc. that is largely or nearly as stated, but, due to manufacturing tolerances and the like, may in practice result in a situation in which the structure, configuration, dimension, etc. is not always or necessarily precisely as stated. For example, describing two lengths as "substantially equal" or "approximately equal" means that the two lengths are the same for all practical purposes, but they may not (and need not) be precisely equal at sufficiently small scales. As another example, a structure that is "substantially vertical" or "approximately vertical" would be considered to be vertical for all practical purposes, even if it is not precisely at 90 degrees relative to horizontal.

The drawings are not necessarily to scale, and the dimensions, shapes, and sizes of the features may differ substantially from how they are depicted in the drawings.

Although specific embodiments have been disclosed, it will be evident that various modifications and changes may be made thereto without departing from the broader spirit and scope of the disclosure. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

The invention claimed is:

1. A printed circuit board, comprising:
   a signal trace layer comprising:
   a first signal trace comprising a first portion and a second portion, wherein the first and second portions of the first signal trace are disjoint,
   a first component pad coupled to the first portion of the first signal trace,
   a second component pad coupled to the second portion of the first signal trace,
   a second signal trace, the second signal trace comprising a first portion and a second portion, wherein the first and second portions of the second signal trace are disjoint,
   a third component pad coupled to the first portion of the second signal trace, and
   a fourth component pad coupled to the second portion of the second signal trace; and
   a reference plane situated under the signal trace layer, wherein the reference plane comprises a dual-spiral common-mode filter, wherein:
a first at least part of the dual-spiral common-mode filter is situated under at least a portion of (a) the first component pad, (b) the second component pad, or (c) both (a) and (b),
a second at least part of the dual-spiral common-mode filter is situated under at least a portion of (i) the third component pad, (ii) the fourth component pad, or (iii) both (i) and (ii), and
the dual-spiral common-mode filter comprises a first spiral portion connected to a second spiral portion.

2. The printed circuit board recited in claim 1, wherein a spiraling direction of the first spiral portion is opposite a spiraling direction of the second spiral portion.

3. The printed circuit board recited in claim 1, wherein a spiraling direction of the first spiral portion and a spiraling direction of the second spiral portion are the same.

4. The printed circuit board recited in claim 1, wherein the first and second spiral portions are approximate mirror images of each other.

5. The printed circuit board recited in claim 1, wherein each of the first and second spiral portions has a substantially rectangular shape.

6. The printed circuit board recited in claim 1, wherein an overall length of the dual-spiral common-mode filter is between approximately 10 mm and approximately 25 mm.

7. The printed circuit board recited in claim 1, wherein a pattern width of the dual-spiral common-mode filter is between approximately 0.05 mm and approximately 0.15 mm.

8. The printed circuit board recited in claim 1, wherein the dual-spiral common-mode filter has a substantially rectangular shape, and wherein an aspect ratio of the dual-spiral common-mode filter is greater than 1, and wherein a longer dimension of the dual-spiral common-mode filter is perpendicular to the first and second signal traces.

9. A data storage device comprising the printed circuit board recited in claim 1.

10. The printed circuit board recited in claim 5, wherein an aspect ratio of the dual-spiral common-mode filter is between 1 and approximately 6.

11. The printed circuit board recited in claim 8, wherein the first and second spiral portions are approximate mirror images of each other.

12. A printed circuit board, comprising: a signal trace layer comprising a first signal trace, the first signal trace comprising a first portion and a second portion, wherein the first and second portions of the first signal trace are disjoint; a reference plane comprising a via-less dual-spiral common-mode filter, wherein the via-less dual-spiral common-mode filter comprises a pattern comprising a first spiral portion connected to a second spiral portion by a connector portion; and an insulating layer disposed between the signal trace layer and the reference plane, wherein: the via-less dual-spiral common-mode filter is situated below the first signal trace, and the first and second portions of the first signal trace are situated above the first spiral portion.

13. The printed circuit board recited in claim 12, wherein a length of the pattern is between approximately 10 mm and approximately 25 mm.

14. The printed circuit board recited in claim 12, wherein a spiraling direction of the first spiral portion is opposite a spiraling direction of the second spiral portion.

15. The printed circuit board recited in claim 12, wherein the first and second spiral portions are approximate mirror images of each other.

16. The printed circuit board recited in claim 12, wherein each of the first and second spiral portions has a substantially rectangular shape.

17. The printed circuit board recited in claim 12, wherein a pattern width of the via-less dual-spiral common-mode filter is between approximately 0.05 mm and approximately 0.15 mm.

18. The printed circuit board recited in claim 12, further comprising:
a first component pad coupled to the first portion of the first signal trace and situated above the first spiral portion, and
a second component pad coupled to the second portion of the first signal trace and situated above the first spiral portion.

19. A data storage device comprising the printed circuit board recited in claim 12.

20. The printed circuit board recited in claim 16, wherein an aspect ratio of the via-less dual-spiral common-mode filter is between 1 and approximately 6.

* * * * *